(12) United States Patent
Shiina

(10) Patent No.: US 8,999,122 B2
(45) Date of Patent: *Apr. 7, 2015

(54) INSULATOR INTERPOSED TYPE PLASMA PROCESSING APPARATUS

(75) Inventor: Yuichi Shiina, Chuo-ku (JP)

(73) Assignee: Ferrotec Corporation, Tokyo (JP)

(*) Notice: Subject to any disclaimer, the term of this patent is extended or adjusted under 35 U.S.C. 154(b) by 318 days.

This patent is subject to a terminal disclaimer.

(21) Appl. No.: 13/122,392

(22) PCT Filed: Feb. 10, 2010

(86) PCT No.: PCT/JP2010/051936
§ 371 (c)(1),
(2), (4) Date: Apr. 1, 2011

(87) PCT Pub. No.: WO2010/113544
PCT Pub. Date: Oct. 7, 2010

(65) Prior Publication Data
US 2011/0180403 A1 Jul. 28, 2011

(30) Foreign Application Priority Data
Mar. 31, 2009 (JP) ................. 2009-085845

(51) Int. Cl.
*C23C 14/00* (2006.01)
*H01J 37/32* (2006.01)

(52) U.S. Cl.
CPC ..... *H01J 37/32422* (2013.01); *H01J 37/32357* (2013.01); *H01J 37/32871* (2013.01)

(58) Field of Classification Search
USPC .................................. 204/298.41
See application file for complete search history.

(56) References Cited

U.S. PATENT DOCUMENTS

| | | | | |
|---|---|---|---|---|
| 5,399,830 A | * | 3/1995 | Maruyama | 219/121.43 |
| 6,319,369 B1 | * | 11/2001 | Flynn et al. | 204/192.38 |
| 2001/0042836 A1 | * | 11/2001 | Olson et al. | 250/424 |
| 2005/0115931 A1 | * | 6/2005 | Akahori et al. | 219/121.36 |
| 2007/0023282 A1 | * | 2/2007 | Murakami | 204/298.41 |
| 2010/0018859 A1 | * | 1/2010 | Shiina | 204/298.41 |

FOREIGN PATENT DOCUMENTS

| | | |
|---|---|---|
| JP | 2002-8893 A | 1/2002 |
| JP | 2002-105628 A | 4/2002 |
| JP | 2005-264255 A | 9/2005 |
| JP | 2006-274294 A | 10/2006 |
| JP | 2008-50653 A | 3/2008 |
| WO | WO 2005-074334 A | 8/2005 |
| WO | WO 2008-038700 A | 4/2008 |
| WO | WO 2009-119655 A | 10/2009 |

* cited by examiner

*Primary Examiner* — Keith Hendricks
*Assistant Examiner* — Stefanie S Wittenberg
(74) *Attorney, Agent, or Firm* — DLA Piper LLP (US)

(57) ABSTRACT

Electrically charged droplets and neutral droplets mixed with plasma are removed with better efficiency, and an improvement in the surface treatment precision of film formation by high purity plasma is sought.

In a plasma processing apparatus including plasma generating portion A, plasma transport tube B and plasma processing portion C, an insulator interposed plasma processing apparatus is constituted in which plasma transport tube B is made electrically independent from plasma generating portion A and plasma processing portion C electrically by interposing insulator IS and insulator IF between the starting end side and the finishing end side of the plasma transport tube. Plasma transport tube B is divided into multiple small transport tubes B01, B23 through intermediate insulator I11, and each small transport tube is made independent electrically. The electric potential of the plasma transport tube or the small transport tubes is set to GND, a variable positive electric potential, or a variable negative electric potential, by putting the plasma transport tube or the multiple small transport tubes in an electric floating state, or connecting bias power supplies EB 01, EB 23 for transport tube. Also, the small transport tubes are connected in a bent manner, and droplets are removed by the geometric structure.

17 Claims, 15 Drawing Sheets

FIG. 9
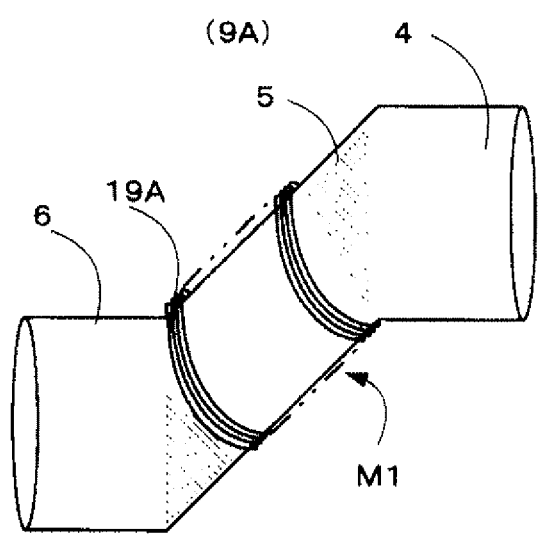
(9A)
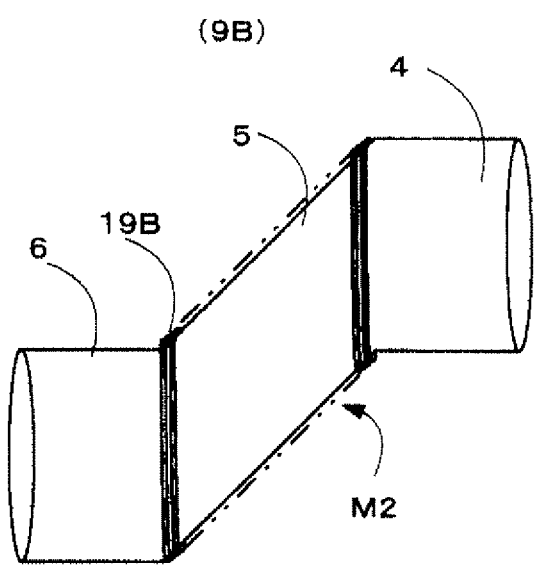
(9B)

FIG. 11
(11A)
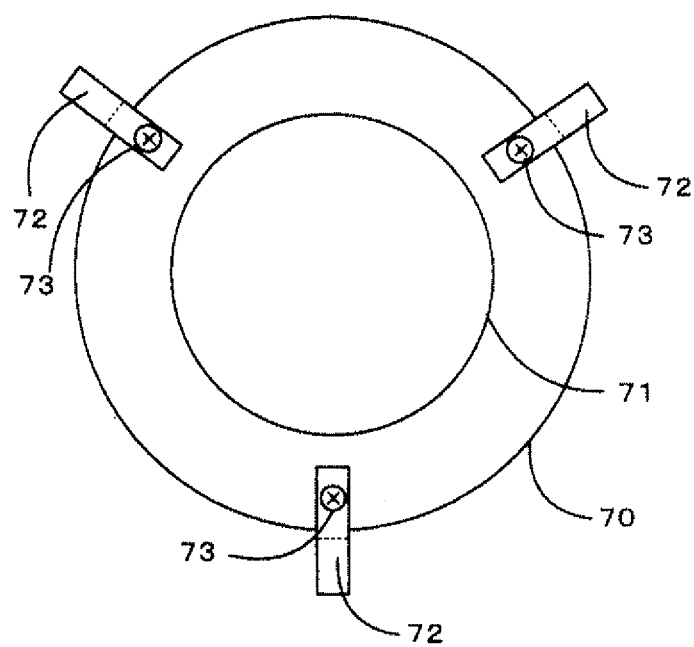
(11B)
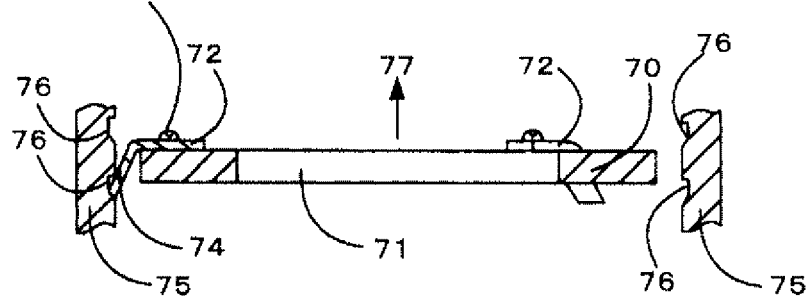

INSULATOR INTERPOSED TYPE PLASMA PROCESSING APPARATUS

FIELD OF THE INVENTION

The present invention relates to a plasma processing apparatus in which a plasma treatment such as a film formation is done on an object to be treated in a plasma processing portion, by generating plasma from a target surface by doing a vacuum arc discharge in an arc discharge portion set under a vacuum environment, and while removing droplets mixed in said plasma, transporting said plasma to the plasma processing portion through a plasma transport tube.

BACKGROUND ART

Normally, it is known that by forming a thin film or injecting ions in plasma onto the surface of a solid material, the solid surface characteristics are improved. A film formed using plasma including metal ions and nonmetal ions strengthens the abrasion and corrosion resistances of a solid surface, and it is useful as a protective film, an optical thin film, and a transparent electroconductive film among others. In particular, as for carbon films using carbon plasma, the utility value is high as diamond like carbon films (so-called DLC films) comprising amorphous mixed crystals of diamond and graphite structures, As a method for generating plasma including metal ions and nonmetal ions, there is a vacuum arc plasma method. Vacuum arc plasma is formed by an arc discharge occurring between a cathode and an anode. The cathode material evaporates from an existing cathode spot of the cathode surface, and it is plasma formed by this vaporized cathode material. Also, when a reactive gas is introduced as the environmental gas, the reactive gas is ionized simultaneously. An inert gas (so-called noble gas) may be introduced together with said reactive gas, and said inert gas can also be introduced instead of said reactive gas. By means of such plasma, a surface treatment can be done by a thin film formation or an ion injection onto a solid surface.

Normally, in a vacuum arc discharge, at the same time as vacuum arc plasma constituent particles such as cathode material ions, electrons, and cathode material neutral atom groups (atoms and molecules) are ejected by a cathode spot, cathode material particles named droplets of size ranging from less than submicron to several hundred microns (0.01-1000 μm) are also ejected. However, it is generation of droplets that cause problems in a surface treatment such as a film formation. When these droplets adhere to the surface of an object to be treated, the uniformity of a film formed on the surface of the object to be treated surface is lost, and a defective thin film is caused.

As one method to solve the problem of droplets, there is a magnetic filter method. As an example of this magnetic filter method, there is one in which vacuum arc plasma is transported to the plasma processing portion through a curved droplet capture duct. According to this method, the generated droplets are adhered and captured (collected) at the duct inner peripheral wall, and a plasma stream that nearly does not contain droplets is obtained at the duct outlet. Also, a curved magnetic field is formed by magnets placed along the duct, and it is comprised so that the plasma stream is bent by this curve magnetic field, and the plasma is guided efficiently to the plasma processing portion.

A plasma arc machining apparatus having a droplet collecting portion is disclosed in Japanese Patent Laid-Open No. 2002-8893 bulletin (patent document 1). FIG. 15 is a schematic configuration diagram of a conventional plasma processing apparatus. At plasma generating portion 102, an electric spark is caused between cathode 104 and trigger electrode 106, and plasma 109 is produced by generating a vacuum arc between cathode 104 and anode 108. Power supply 110 for generating an electric spark and a vacuum arc discharge is connected to plasma generating portion 102, and plasma stabilizing magnetic field generators 116a, 116b for stabilizing plasma 109 are positioned. Plasma 109 is guided to plasma processing portion 112 from plasma generating portion 102, and object to be treated 114 placed in plasma processing portion 112 is surface-treated by said plasma 109. Also, a reactive gas is introduced as necessary by gas introduction system Gt connected to plasma processing portion 112, and reactant gases and the plasma stream are exhausted by gas exhaust system Gh.

Plasma 109 ejected from plasma generating portion 102 is bent to a T-shape toward a direction away from plasma generating portion 102 by the magnetic field, and is flowed into plasma processing portion 112. At the position facing plasma generating portion 102, droplet collecting portion 120 is positioned, where cathode material particles (droplets) 118 generated as a byproduct at cathode at the time of generation of plasma 109 are collected. Therefore, droplets 118 not under an influence of the magnetic field advances to droplet collecting portion 120 and are collected, thereby preventing an intrusion of droplets 118 into plasma processing portion 112. As for a specific droplet collecting means, for example, in Japanese Patent Laid-Open No. 2002-105628 bulletin (patent document 2), it is disclosed that droplets that do not arrive at a plasma processing portion are adhered and collected by baffles set up in a plasma duct inner wall,

[patent document 1] Japanese Patent Laid-Open No. 2002-8893 bulletin

[patent document 2] Japanese Patent Laid-Open No. 2002-105628 bulletin

DISCLOSURE OF THE INVENTION

Problems to be Solved by the Invention

In the conventional plasma processing apparatus shown in FIG. 15, neutral droplets 118 not influenced by said magnetic field is collected at droplet collecting portion 120, but there were cases where electrically charged droplets on which an electric charge has been given by interactions with plasma 109 were guided to plasma processing portion 112 by the magnetic field. Furthermore, there were cases in which droplets of small particle diameter not collected at droplet collecting portion 120 were guided to plasma processing portion 112 while reflecting on the wall surface. As thus described, because droplets adhere to surface of the object to be treated when the droplets are reflected into plasma processing portion 112, problems were caused in which the uniformity of the thin film formation on and the surface reforming of the surface of the object to be treated was lost, and the surface characteristics of the object to be treated were decreased.

Also, as explained previously, in said magnetic filter method, because the plasma stream is bent by the bending magnetic field, and the plasma is moved efficiently to the plasma processing portion, it cannot prevent charged droplets and minute droplets mixed into the plasma stream from being guided into the plasma processing portion, and colliding or adhering to the surface of the object to be treated.

In the recent plasma film formation technology, film formation using of various kinds of materials is done, but an improvement of the film formation precision is demanded such as the smoothness by a film formation equipment. As described above, because the droplet adhesion strongly influences the film formation precision, an improvement of the droplet removal efficiency in plasma generating apparatuses is considered to be necessary.

Therefore, the object of the present invention is to provide a plasma processing apparatus, in which it is possible to remove neutral droplets and electrically charged droplets mixed in plasma even more efficiently in a plasma processing apparatus, and carry out an improvement of the surface treatment precision of film formation by high purity plasma.

Means to Solve the Problems

Among the droplets generated from a target, there exist electrically charged droplets taking on positive electricity and/or negative electricity (positive droplets and negative droplets), and neutral droplets that are not electrically charged. As a result of having studied intensively in order to remove these two kinds of droplets, the present inventor discovered three kinds of effective methods to remove said droplets.

First, the removal method of electrically charged droplets is explained. If a difference in the electric potential exists in a plasma transport tube, electrically charged droplets are forcibly driven by the electric force based on said electric potential difference, and if its direction is the plasma travelling direction, they are forcibly mixed into the plasma. Therefore, if the whole plasma transport tube is electrically made constant in terms of the electric potential by insulating and separating the plasma transport tube from the plasma generating portion and the plasma processing portion, an electric force is not caused toward electrically charged droplets in a plasma transport tube, and it becomes possible to remove electrically charged droplets by the method to be described below, in the same manner as neutral droplets. For making a plasma transport tube constant in terms of the electric potential, cases where it is made into an electrically floated state (an electric floating state) without providing an electric potential from outside at all to the plasma transport tube, and cases where the plasma transport tube is forced to maintain a constant electric potential by means of a bias power supply are both included.

Second, if said plasma transport tube is divided into small transport tubes of multiple steps by means of intermediate insulators, individual small transport tubes can be electrically insulated from outside by the insulation effect of the intermediate insulators, and as a result, the insulation property of the whole plasma transport tube can be improved. As for the methods to make the electric potential of the individual small transport tube constant, there is a case where it is made into an electrically floated state (an electric floating state) without providing an electric potential from outside at all to the individual small transport tubes, and there is also a case where the individual small transport tubes are forcibly maintained at a constant electric potential by connecting a bias power supply to the individual small transport tubes. In the case of this constant electric potential state, an electric force does not act toward electrically charged droplets in the small transport tubes, and it becomes possible to remove electrically charged droplets in the same manner as neutral droplets by the method described below, When a bias power supply is attached to the individual small transport tubes, the electric potential of the individual small transport tube can be set to an arbitrary positive electric potential/a negative electric potential and GND (ground electric potential) by said bias power supply. If the electric potentials of adjacent small transport tubes are set individually to a high potential and a low voltage within a range including the positive, the negative, and GND (ground electric potential), positive droplets are electrically adsorbed to the wall surface of the small transport tubes by the electric force from the adjacent high potential to the low potential, and on contrary, negative droplets are adsorbed electrically when the electric force is from the low potential to the high potential. Therefore, the electrically charged droplets can be electrically absorbed on the wall surface and removed.

Third, the removal method of neutral droplets is proposed. Because neutral droplets do not receive electrical and magnetic actions, they advance straightly while reflecting on the wall surface of a plasma transport tube. If the plasma transport tube is made into a looped-back bent structure, because neutral droplets do not bend in the bending portion but instead they advance straightly, they collide and are removed by the wall surface. Specifically, if a plasma straightly advancing tube, a first plasma advancing tube bent substantially 90 degrees in a T-shape compared to this plasma straightly advancing tube, a second plasma advancing tube inclinedly arranged at a predetermined bending angle compared to the first plasma advancing tube, and a third plasma advancing tube connected in a bent manner at the finishing end of said second plasma advancing tube are set up as a plasma transport tube, the neutral droplets advance straightly in the thrice bending portions, collide against the wall surface, and are removed. In other words, a method to remove neutral droplets by making the plasma transport tube into a geometrical configuration of bending in three steps of T-shaped bending, inclined bending, and reverse-inclined bending is also suggested.

The present inventor made the following study to establish the three above removal methods of neutral droplets. In this study, as mentioned above, an undivided plasma transport tube was set in an electric floating state. As a droplet removing portion was arranged onto a plasma transport tube, the relation between the form of the plasma transport tube and the plasma treatment condition (film formation rate) were verified. In this verification experiment, film formation rates (nm/sec) were determined in film formation treatments in which plasma irradiation was done for 4 seconds on one substrate. A substrate with size of 2.5 in (inch) width d1, 2.5 in (inch) length D2, and an arbitrary thickness t was used. FIG. 14 shows the relation of the plasma transport distance with respect to the film formation rate. Throughout this specification, the plasma transport distance is defined by the total distance in which a plasma ejected by the plasma generating portion (target surface) arrives at the object to be treated (substrate) in the plasma processing portion.

A1, A2 of FIG. 14 respectively shows the case for the plasma transport tube bent in a T-shape shown in FIG. 15, and the case in which the curved plasma transport tube explained with said magnetic filter method was used. The respective plasma transport distance is 1440 mm and 1380 mm. The film formation rate in the T-shaped type plasma transport tube of A1 is about 0.3 nm/sec, and the film formation rate in the curved plasma transport tube of A2 is about 0.6 nm/sec. It is understood from the above verification that the plasma transport distance influences the film formation rate. Here, FIG. 14 is understood by means of conversion formula 1 nm/sec=10 A/sec.

A film formation rate of greater than about 0.8 nm/sec is necessary for a normal film formation condition used by semiconductor substrates. Also, as for the adhered mass of droplets per unit area, less than 50 is preferable in a substrate with size of 2.5 in (inch)×2.5 in (inch), but about 1000 droplets had adhered in the above verification. When it is considered that that the plasma transport distance influences the film formation rate, it is expected that the film formation rate can be improved if the plasma transport distance by the plasma transport tube is shortened, but it was found out that when the transport pathway is merely shortened, the quantity of intrusion by the droplets increases along with it.

Examining the verification result intensively, the present inventor came to obtain a knowledge that by forming an inclination type plasma advancing tube in the middle of a plasma transport tube, and thus forming a plasma advancing path of three stages in a bent manner, invasion of droplets is prevented more effectively, and a plasma treatment using a suitable film formation rate becomes possible, even if the entire plasma transport tube is shortened.

The present invention was done to solve the above problem, and the first form of the present invention is, in a plasma processing apparatus including a plasma generating portion that generates plasma from a target surface by a vacuum arc discharge under a vacuum environment, a plasma transport tube that transports said plasma generated by said plasma generating portion, and a plasma processing portion that processes an object to be treated by said plasma supplied from said plasma transport tube, an insulator interposed type plasma processing apparatus characterized in that a starting end side insulator is interposed between said plasma generating portion and said plasma transport tube, a finishing end side insulator is interposed between said plasma transport tube and said plasma processing portion, and said plasma generating portion, said plasma transport tube, and said plasma processing portion are mutually separated electrically so that an electric influence from said plasma generating portion and said plasma processing portion on said plasma transport tube is blocked.

The second form of the present invention is the insulator interposed type plasma processing apparatus of said first form, wherein said plasma transport tube is divided into a plurality of small transport tubes, said small transport tubes are electrically separated from one another by interposing an intermediate insulator between neighboring said small transport tubes, and an electric influence on an arbitrary said small transport tube from other said small transport tubes is blocked.

The third form of the present invention is the insulator interposed type plasma processing apparatus of said first or second form, wherein said plasma transport tube or said plurality of small transport tubes is in an electrically floating state in which an electric potential is not applied forcibly.

The fourth form of the present invention is the insulator interposed type plasma processing apparatus of said first or second form, wherein a bias power supply for transport tube is connected to said plasma transport tube or each of said small transport tubes, so that a magnitude of an electric potential (including ground electric potential) applied to said plasma transport tube or said small transport tubes and a polarity of said electric potential can be varied.

The fifth form of the present invention is the insulator interposed type plasma processing apparatus of any one of said first to fourth forms, wherein a target interchange portion container that accommodates a reserve target is positioned underneath a plasma generating portion container accommodating a target that generates plasma while being electrically insulated from said target, said plasma generating portion container and said target exchange portion container are separated electrically by interposing an inter-container insulator between said plasma generating portion container and said target interchange portion container, said plasma generating portion container is set to an electrically floating state in which an electric potential is not applied forcibly, and a bias power supply for container is installed to said target interchange portion container so that a magnitude of an electric potential (including ground electric potential) applied by said target interchange portion container and a polarity of said electric potential can be varied.

The sixth form of the present invention is the insulator interposed type plasma processing apparatus of any one of said first to fifth forms, wherein a bias power supply for processing portion is attached to a plasma processing portion container that accommodates said object to be treated, so that a magnitude of an electric potential (including ground electric potential) applied to said plasma processing portion container and a polarity of said electric potential can be varied.

The seventh form of the present invention is the insulator interposed type plasma processing apparatus of any one of said first to sixth forms, wherein said object to be treated in said plasma processing portion is set to an electrically floating state in which an electric potential is not applied forcibly, or a bias power supply for object to be treated is attached so that a magnitude of an electric potential (including ground electric potential) applied to said object to be treated and a polarity of said electric potential can be varied.

The eighth form of the present invention is the insulator interposed type plasma processing apparatus of any one of said first to seventh forms, wherein said plasma transport tube is composed of a plasma straightly advancing tube connected to said plasma generating portion, a first plasma advancing tube connected in a bent manner to said plasma straightly advancing tube, a second plasma advancing tube diagonally arranged and connected at a finishing end of said first plasma advancing tube in a bent manner with predetermined bending angle with respect to a tube axis of said first plasma advancing tube, a third plasma advancing tube connected in a bent manner to a finishing end of said second plasma advancing tube so that said plasma is exhausted from a plasma outlet, and total length L for said plasma to arrive from said target surface to said object to be treated is set to satisfy 900 mm≤L≤1350 mm.

The ninth form of the present invention is the insulator interposed type plasma processing apparatus of said eighth form, wherein said second plasma advancing tube is placed geometrically at a position off a straight line of sight from a plasma outlet of said third plasma advancing tube to a plasma outlet side of said first plasma advancing tube.

The tenth form of the present invention is the insulator interposed type plasma processing apparatus of said ninth form, wherein $\theta \geq \theta_0$ is satisfied when an angle of elevation from a tube cross section top end of the plasma entrance port side of said third plasma advancing tube to a tube cross section bottom end of the plasma outlet side of said first plasma advancing tube is defined as $\theta$, and an angle of elevation from a tube cross section bottom end of the plasma outlet side of said third plasma advancing tube to a tube cross section top end of the plasma outlet side of said second plasma advancing tube is defined as $\theta_0$.

The eleventh form of the present invention is the insulator interposed type plasma processing apparatus of said eighth, ninth, or tenth form, wherein a magnetic field generating means for plasma transportation that generates a magnetic field for plasma transportation is set up in each of said plasma straightly advancing tube, said first plasma advancing tube, said second plasma advancing tube, and said third plasma advancing tube, a deflection magnetic field generating means for deflecting said magnetic field for plasma transportation is attached in said first plasma advancing tube and/or said second plasma advancing tube, and a plasma stream is deflected toward a tube center side by a deflection magnetic field generated by said deflection magnetic field generating means.

The twelfth form of the present invention is the insulator interposed type plasma processing apparatus of said eleventh form, wherein said deflection magnetic field generating means comprises a yoke placed around an outer circumference of said first plasma advancing tube and/or said second plasma advancing tube and a magnetic field coil wound around said yoke, said yoke being adjusted by sliding along the tube axis direction, rotating along the circumferential direction, and/or swinging toward the tube axis direction.

The thirteenth form of the present invention is the insulator interposed type plasma processing apparatus of said eleventh form, wherein said magnetic field generating means for plasma transportation comprises a magnetic field coil wound around an outer tube circumference of each of said plasma straightly advancing tube, said first plasma advancing tube, said second plasma advancing tube, and said third plasma advancing tube.

The fourteenth form of the present invention is the insulator interposed type plasma processing apparatus of said thirteenth form, wherein said magnetic field coil wound around a outer tube circumference of said second plasma advancing tube comprises a magnetic field coil wound elliptically around said outer tube circumference along an inclination axis.

The fifteenth form of the present invention is the insulator interposed type plasma processing apparatus of any one of said eighth to fourteenth forms, wherein a droplet collecting plate is implanted into a inner tube wall surface of each of said plasma straightly advancing tube, said first plasma advancing tube, said second plasma advancing tube, and said third plasma advancing tube, an area of said implanting being greater than or equal to 70% of an inner tube wall surface area.

The sixteenth form of the present invention is the insulator interposed type plasma processing apparatus of any one of said eighth to fifteenth forms, wherein said second plasma advancing tube is set up as a radially enlarged tube, said first plasma advancing tube is set up as an introduction side radially reduced tube connected to a plasma introduction side starting end of said radially enlarged tube, and said third plasma advancing tube is set up as a discharge side radially reduced tube connected to a plasma discharge side finishing end of said radially enlarged tube.

The seventeenth form of the present invention is the insulator interposed type plasma processing apparatus of any one of said eighth to sixteenth forms, wherein a rectification magnetic field generating means for converging and rectifying in travelling direction a plasma stream supplied from said second plasma advancing tube to said third plasma advancing tube and/or a deflection oscillation magnetic field generating means for deflecting and oscillating said plasma stream in a cross-sectional direction is/are installed in a connecting section between said second plasma advancing tube and said third plasma advancing tube.

The eighteenth form of the present invention is the insulator interposed type plasma processing apparatus of said fifteenth form, wherein said droplet collecting plate implanted into said second plasma advancing tube is electrically shielded from a tube wall of said second plasma advancing tube, and a bias voltage application means for applying a bias voltage to said droplet collecting plate is installed.

The nineteenth form of the present invention is the insulator interposed type plasma processing apparatus of any one of said eighth to eighteenth forms, wherein one or more apertures whose installation position can be varied along a tube axis direction are arranged inside said second plasma advancing tube, and said aperture has an opening of a predetermined area.

Effects of the Invention

According to the first form of the present invention, by interposing a starting end side insulator between said plasma generating portion and said plasma transport tube, and interposing a finishing end side insulator between said plasma transport tube and said plasma processing portion, a complete electrical independence is achieved by said plasma generating portion, said plasma transport tube, and said plasma processing portion. As a result, an electric influence from said plasma generating portion and said plasma processing portion toward the plasma transport tube is completely blocked, the plasma transport tube that is usually formed from a metal becomes constant in terms of the electric potential as a whole, and an electric potential difference does not exist in the plasma transport tube. Because there is no electric potential difference, an electrical force, based on electric potential difference, toward charged particles is not generated. Because electrically charged droplets are one type of charged particles, an electrical force does not act on electrically charged droplets in a plasma transport tube in a constant electric potential state, and therefore electrically charged droplets can be handled in the same manner as neutral droplets. Therefore, by means of the geometric removal method of neutral droplets described below, it becomes possible for electrically charged droplets to be removed together with neutral droplets while advancing through the plasma transport tube. Because of this, the plasma supplied from the plasma transport tube becomes a high purity plasma from which neutral droplets and electrically charged droplets have been removed by the neutral droplet removal structure, and by this high purity plasma, a high purity plasma treatment is made possible toward an object to be treated in the plasma processing portion.

According to the second form of the present invention, because said plasma transport tube is divided into small transport tubes of multiple steps by means of an intermediate insulator, the small transport tubes become electrically independent from one another, and an electrical influence toward one small transport tube from the other remaining small transport tubes can be blocked. Of course, the whole of the small transport tubes is insulated by the starting end side insulator and the finishing end side insulator from the plasma generating portion and the plasma processing portion, and the electrical insulation state of the small transport tubes is improved even more than the first form. As a result, the individual small transport tubes are maintained to a constant electric potential, an electrical force toward electrically charged droplets is not exerted at all in each small transport tube, and it becomes possible for electrically charged droplets to be removed only by a geometric removal structure, in the same manner as neutral droplets.

According to the third form of the present invention, a bias power supply is not connected at all to said plasma transport tube or said multiple small transport tubes, and it becomes an electric floating state in which an electric potential is not provided forcibly. The plasma transport tube and the divided small transport tubes are metal tubes, and if a bias power supply is not connected, the whole of the metal tube is made to a constant electric potential. An electric charge is not injected from the outside because of the insulator, and an electric charge does not exist in the plasma transport tube and the small transport tubes. Because of this, the metal tubes such as the plasma transport tube or the small transport tubes are maintained to a constant electric potential. There is no case in which an electric charge is injected from air, but here, a hypothetical case in which a charge injection from air into the Metal tubes is assumed. Then, electric charges are injected into the metal tube, but the electric charges only become distributed throughout the metal tube surface by the repulsive force between the electric charges, and therefore do not remain within the metal tube. As a result, even without bringing up Gauss's theory of electromagnetism, it is obvious that the electric potential of the metal tube surface becomes constant. Therefore, in the first form, the whole of said plasma transport tube becomes constant in term of the electric potential, and in the second form, the whole of said multiple small transport tubes becomes constant in term of the electric potential. Because of this, an electric force is not exerted on electrically charged droplets advancing through these metal tubes, and it becomes possible to remove electrically charged droplets by a geometric structure of the plasma transport tube or the small transport tubes, in the same manner as neutral droplets.

According to the fourth form of the present invention, because a bias power supply for transport path is connected to said plasma transport tube or each of said small transport tubes, said plasma transport tube or said small transport tubes will have a predetermined electric potential that is provided forcibly by the bias power supply. Said bias power supply can provide a variable positive electric potential, a variable negative electric potential, or GND (ground electric potential). As for the variable range of the positive electric potential, 0-50 (V) is desirable, and as for the variable range of the negative electric potential, 0 to −50 (V) is desirable. The choice of any one of a positive electric potential, a negative electric potential, or GND is chosen by the density of the supplied plasma to the plasma processing portion, and the removal efficiency of the electrically charged droplets. Also, the adjustment of the magnitude of the positive electric potential and the magnitude of the negative electric potential is done too by said plasma density and said removal efficiency of the electrically charged droplets. The present inventor found that in a case where said plasma transport tube is not divided, setting said plasma transport tube in an electrically floating state (bias electric potential not provided) is experimentally favorable. The present inventor found that when said plasma transport tube is divided in two, setting the small transport tube which is near the plasma generating portion to −5 to −10 (V), and the small transport tube which is near the plasma processing portion to GND gives a good result, and therefore is favorable with the experimental system currently in operation. Because these favorable configurations depend upon the experimental device and the experimental environment, there can also be other bias electric potential designs.

In addition, when a positive electric potential is provided to the transport tube by a bias power supply, the plasma of positive electricity is repelled and the plasma transport efficiency increases, and the film formation rate in the plasma processing portion increases. However, the removal efficiency of electrically charged droplets tends to decrease, and the amount of droplets in the formed film tends to increase. On contrary, when a negative electric potential is provided to the transport tube by a bias power supply, the plasma of positive electricity is drawn and the plasma transport efficiency falls, and the deposition rate in the plasma processing portion decreases. However, the removal efficiency of electrically charged droplets tends to increase, and the amount of droplets in the formed film tends to decrease. Therefore, there is an inverse relation between the film formation rate and the number of droplets deposited in a formed film. Also, cases exist where, even when droplets are decreased, the amount of droplets increase eventually when the deposition rate decreases, and the film formation time for obtaining a predetermined film thickness increases. Therefore, to satisfy both the deposition rate and the droplet number density, it is necessary to delicately adjust the electric potential provided by the bias power supply. Because of this, by dividing the plasma transport tube into multiple small transport tubes, and adjusting the bias electric potential of each small transport tube mutually, it becomes possible to satisfy both the film formation rate and the droplet number density. The more the number of partitions increases, the easier said adjustment becomes.

According to the fifth form of the present invention, an arbitrary bias electric potential can be provided by electrically insulating the plasma generating portion container and the target exchange portion container by the inter-container insulator, setting said plasma generating portion container in an electric floating state, and attaching the bias power supply for container to said target exchange portion container. When said plasma generating portion container is set to an electric floating state, said plasma generating portion container does not exert an electrical influence to the generated plasma, and the advancement of the plasma to the plasma transport tube can be carried out smoothly. Also, a variable positive electric potential, a variable negative electric potential, or GND can be provided to said target exchange portion container, and an optimum setting of the plasma processing apparatus becomes possible. In the currently operating experiment system, the choice of GND is favorable from the point of view of safety, but because it depends on the experimental device and the experimental environment, other bias electric potential designs are also possible.

According to the sixth form of the present invention, because the bias power supply for processing portion is attached to the plasma processing portion container that accommodates said object to be treated, it is possible to vary freely the magnitude of the electric potential (including a ground electric potential) and the polarity of the electric potential provided to said plasma processing portion container. A variable positive electric potential, a variable negative electric potential, or GND can be provided to said plasma processing portion container, and it becomes possible to set optimally the plasma processing apparatus. In the currently operating experiment system, the choice of GND is favorable from the point of view of safety, but because it depends on the experimental device and the experimental environment, other bias electric potential designs are also possible.

According to the seventh form of the present invention, said object to be treated in said plasma processing portion may be set to an electric floating state, or by attaching the bias power supply for object to be treated, the magnitude of the electric potential (including ground electric potential) and the polarity of the electric potential provided to said object to be treated can be varied freely. When a bias electric potential is provided to said object to be treated, a variable positive electric potential, a variable negative electric potential, or GND can be chosen, and it becomes possible to set optimally the plasma processing. In the currently operating experiment system, it is favorable to set it in an electrically floating state, but because it depends on the experimental device and the experimental environment, other bias electric potential designs are also possible.

According to the eighth form of the present invention, the plasma generating apparatus is offered in which said plasma transport tube is composed in a bent manner in three stages of a plasma straightly advancing tube connected to said plasma generating portion, a first plasma advancing tube connected in a bent manner to said plasma straightly advancing tube, a second plasma advancing tube diagonally arranged and connected at the finishing end of said first plasma advancing tube in a bent manner with a predetermined bending angle with respect to the tube axis of said first plasma advancing tube, and a third plasma advancing tube connected in a bent manner to the finishing end of said second plasma advancing tube so that the plasma is exhausted from a plasma outlet, and total length L from the target surface to the object to be treated is set to satisfy 900 mm≤L≤1350 mm. Furthermore in details, said length L is defined as the total length that is the sum of length L0 from the target surface to the outlet of the plasma straightly advancing tube, length L1 of the first plasma advancing tube, length L2 of the second plasma advancing tube, length L3 of the third plasma advancing tube, together with plasma effective distance L4 that is the distance for the plasma to reach from the plasma outlet of said third plasma advancing tube to the object to be treated. That is to say, L=L0+L1+L2+L3+L4, and the detail is shown in FIG. 1. As thus described, because it is set so that said total length L satisfies 900 mm≤L≤1350 mm, as shown in FIG. 14, the film formation rate can be improved by shortening the plasma transport distance of the plasma advancing path furthermore than the conventional T-type plasma advancing paths and curved plasma advancing paths. Moreover, not merely the straightly advancing pathway is shortened, but neutral droplets are removed highly efficiently by said geometric structure of three stages of bent pathway. Furthermore, electrically charged droplets are also removed highly efficiently by said geometric structure by the configuration of the first to seventh forms, and high purity plasma that can realize an improvement of surface treatment precision of film formation among others can be generated.

Said second plasma advancing tube is inclined in said bending angle (angle of inclination), and droplets can be blocked when the angle of inclination is large, but the film formation rate to the surface of the object to be treated decreases because the plasma density decreases. On contrary, when the angle of inclination is small, droplets intrude the treatment chamber, but the film formation rate to the surface of the object to be treated does not decrease because the decrease in the plasma density is small. Therefore, said angle of inclination can be chosen appropriately from the relation between the film formation rate and the tolerance for droplets.

Said bent pathway of three stages in the present invention by said plasma straightly advancing tube, said first plasma advancing tube, said second plasma advancing tube, and said third plasma advancing tube is comprised by connecting each tube on a same plane, or comprised by positioning them in three dimension spatially.

According to the ninth form of the present invention, said second plasma advancing tube is placed geometrically at the position away from the straight line of sight from the plasma outlet of said third plasma advancing tube to the plasma outlet side of said first plasma advancing tube. Because the droplets led out from said first plasma advancing tube are not exhausted directly from the plasma outlet of said third plasma advancing tube, but instead they collide with the pathway inner wall and are adhered and removed in said bent pathway process of three stages, the droplets adhering to the object to be treated can be largely reduced, and a plasma treatment becomes possible by high purity plasma from which droplets have been removed highly efficiently.

The outlet of said third plasma advancing tube may be connected directly to the outer wall surface of the plasma processing portion described below, or it may be positioned by inserting deeply in the inside of said outer wall surface. Furthermore, while maintaining the positional relationship between the outlet of said third plasma advancing tube and said outer wall surface, a rectifying tube and/or a deflection/oscillation tube could be installed between the second plasma advancing tube and the third plasma advancing tube, like in the 17th form described below.

According to the tenth form of the present invention, $\theta \geq \theta_0$ is satisfied when the angle of elevation from the tube cross section top end of the plasma entrance port side of said third plasma advancing tube to the tube cross section bottom end of the plasma outlet side of said first plasma advancing tube is defined as $\theta$, and the angle of elevation from the tube cross section bottom end of the plasma outlet side of said third plasma advancing tube to the tube cross section top end of the plasma outlet side of said second plasma advancing tube is defined as $\theta_0$. Because of this, said second plasma advancing tube can be placed at the position off the straight line of sight from the plasma outlet of said third plasma advancing tube to the plasma outlet side of said first plasma advancing tube. Therefore, for example, in cases where said bent pathway of three stages is comprised by connecting on a same plane, a tube passage configuration can be realized in which droplets led out from said first plasma advancing tube are not directly exhausted by the plasma outlet of said third plasma advancing tube, and a plasma treatment using high purity plasma from which droplets have been removed highly efficiently becomes possible.

As explained above, needless to say, the outlet of said third plasma advancing tube may be connected directly to the outer wall surface of the plasma processing portion described below, or it may be positioned by inserting deeply in the inside of said outer wall surface. Also, needless to say, a rectifying tube and/or a deflection/oscillation tube could be installed between the second plasma advancing tube and the third plasma advancing tube.

According to the eleventh form of the present invention, the magnetic field generating means for plasma transportation that generates a magnetic field for plasma transportation is set up in each of said plasma straightly advancing tube, said first plasma advancing tube, said second plasma advancing tube, and said third plasma advancing tube, the deflection magnetic field generating means for deflecting said magnetic field for plasma transportation is attached in said first plasma advancing tube and/or said second plasma advancing tube, and the plasma stream is deflected toward the tube center side by the deflection magnetic field generated by said deflection magnetic field generating means. Because of this, the heterogeneity of said magnetic field for plasma transportation at the connecting section of said first plasma advancing tube and/or said second plasma advancing tube, that is to say, the trouble in which the additional magnetic field becomes strong at the inside of the bending portion due to the configuration of said magnetic field coil for magnetic field generation for plasma transportation, is deflected and adjusted by said deflection magnetic field, the plasma stream is guided to the tube passage center, the plasma density is held high, and a plasma treatment using high density, high purity plasma becomes possible.

According to the twelfth form of the present invention, said deflection magnetic field generating means comprises a yoke placed around the outer circumference of said first plasma advancing tube and/or said second plasma advancing tube and a magnetic field coil wound around said yoke, said yoke being adjusted by sliding along the tube axis direction, rotating along the circumferential direction, and/or swinging toward the tube axis direction. Because of this, a cancellation of the heterogeneity of said magnetic field for plasma transportation can be attempted by doing a fine adjustment by said deflection magnetic field through the movement of a said yoke, and an optimum plasma advancing path comprising the geometry of said bent pathway of three stages can be realized.

According to the thirteenth form of the present invention, said magnetic field generating means for plasma transportation comprises a magnetic field coil wound around the outer tube circumference of each of said plasma straightly advancing tube, said first plasma advancing tube, said second plasma advancing tube, and said third plasma advancing tube. Because of this, the plasma transport efficiency is improved by generating said magnetic field for plasma transportation in the whole of said bent pathway of three stages, and a plasma treatment with the use of high density and high purity plasma becomes possible.

When said magnetic field coil for magnetic field generation for plasma transportation is set up in the said second plasma advancing tube by winding in a circular shape along the axis of inclination, a gap is produced in which the coil is not wound near the connecting portion with another tube, an uneven magnetic field is produced, and the plasma transport efficiency drops. Therefore, according to the fourteenth form of the present invention, the magnetic field coil wound around the outer tube circumference of said second plasma advancing tube comprises the magnetic field coil wound elliptically around the outer tube circumference along the inclination axis. Because of this, the plasma transport efficiency is improved without producing an uneven magnetic field by winding the magnetic field coil to the inclination surface of said second plasma advancing tube densely without producing said gap, and a plasma treatment with the use of high density and high purity plasma becomes possible.

According to the fifteenth form of the present invention, the droplet collecting plates are implanted into the inner tube wall surface of each of said plasma straightly advancing tube, said first plasma advancing tube, said second plasma advancing tube, and said third plasma advancing tube, the area of said implanting being greater than or equal to 70% of the inner tube wall surface area. Because of this, scattering droplets can be adhered and collected in a large quantity and reliably by increasing the droplet adhesion surface area in the tube for plasma advancing path, and a high purity of the plasma stream can be realized.

According to the sixteenth form of the present invention, said second plasma advancing tube is set up as a radially enlarged tube, said first plasma advancing tube is set up as an introduction side radially reduced tube connected to the plasma introduction side starting end of said radially enlarged tube, and said third plasma advancing tube is set up as a discharge side radially reduced tube connected to the plasma discharge side finishing end of said radially enlarged tube. Because of this, the plasma stream introduced into said radially enlarged tube from said introduction side radially reduced tube is diffused by the effect of diameter increase of said plasma advancing path by said radially enlarged tube. Because the droplets mixed with the plasma diffuse into said radially enlarged tube by the diffusion of this plasma stream, they collide with the inner wall of said radially enlarged tube, and are adhered and collected. Also, when the plasma stream in said radially enlarged tube is exhausted, the droplets scattered toward the said radially enlarged tube inner wall surface side collide with the step portion and are adhered and is collected by the diameter decrease effect from said radially enlarged tube to said discharge side radially reduced tube, and a re-mixture of the droplets can be prevented without them re-joining the plasma stream. Therefore, the droplets can be adhered to the inner side wall of said radially enlarged tube and can be collected sufficiently, and the droplets can be removed efficiently in the tube pathway of said first plasma advancing tube, said second plasma advancing tube, and said third plasma advancing tube. Also, if the central axes of the radially enlarged tube and the introduction side radially reduced tube and/or the discharge side radially reduced tube are made eccentric without aligning them, the droplets become easier to separate from the plasma stream, and the capture effect of the droplets increases even more. Moreover, a droplet removing portion can be constituted easily and cheaply just by forming said radially enlarged tube in said plasma advancing path. Furthermore, the surface treatment precision of film formation is improved by using the high purity plasma obtained by the improvement of the droplets removal efficiency, and the uniformity of the surface reforming or the formed film on the surface of the object to be treated can be improved markedly.

According to the seventeenth form of the present invention, because there are cases where a plasma stream meanders and diffuses at the connecting portion at the end of the said inclinedly arranged second plasma advancing tube with said third plasma advancing tube, a plasma rectifying tube may be arranged at the outlet of said second plasma advancing tube, and a rectification magnetic field generating means that converges and rectifies the plasma stream forcibly at the outer circumference of this plasma rectifying tube may be set up. When a convergence magnetic field is applied to the plasma travelling direction, the plasma stream that had been meandering or diffusing may be advanced while forcibly converging. Also, by arranging a bell mouth-like deflection/oscillation tube at the outlet of said plasma rectifying tube, and by arranging a deflection/oscillation magnetic field generator (that is to say, a yoke coil) at the outer circumference of said deflection/oscillation tube, a deflection/oscillation magnetic field that oscillates the plasma stream left-right (or up-down) toward the cross sectional direction of the inside of the deflection/oscillation tube can be formed. Also, if it is deflected and oscillated in both the left-right directions (the cross section X-axis direction) and the up-down directions (the cross section Y-axis direction), it becomes possible to scan the plasma stream widely. As thus described, when the irradiation area to the object to be processed is larger than the plasma stream cross section area, it becomes possible to increase or decrease the plasma exposure area freely by deflecting and scanning the plasma stream. Needless to say, said plasma rectifying tube and said deflection/oscillation tube may be positioned together as a set, or each may be positioned individually.

According to the eighteenth form of the present invention, said droplet collecting plate implanted into said second plasma advancing tube is electrically shielded from the tube wall of said second plasma advancing tube, and the bias voltage application means for applying a bias voltage to said droplet collecting plate is installed. Therefore, because said bias voltage is applied to said droplet collecting plate, decrement of the plasma can be restrained by adjusting its bias electric potential, and it becomes possible to increase the plasma transportation efficiency. As for the applied voltage, there are cases where it is positive, and there are cases where it is negative. The application configuration is chosen optimally. When the voltage is positive, positive ions are repelled and pushed toward the transportation direction, and when the voltage is negative, negative ions are repelled and pushed toward the transportation direction. Whether to apply either a positive or a negative voltage is chosen to increase the plasma transportation efficiency. Also, the magnitude of the voltage is controlled variously, and a voltage strength that increases the plasma transportation efficiency is chosen.

According to the nineteenth form of the present invention, one or more apertures whose installation position can be varied along the tube axis direction are arranged inside said second plasma advancing tube, and said aperture has an opening of a predetermined area. Because of this, said second plasma advancing tube can be decreased in diameter by said aperture, and the droplets can be collected, and moreover, the quantity of collection can be adjusted optimally by changing its installation position, thus contributing to an improvement in the droplets removal efficiency. By the way, said opening can not only be set up in the center of said aperture, but it is possible to provide a function in which the plasma stream in the tube is made eccentric so that it meanders.

BRIEF DESCRIPTION OF THE DRAWINGS

FIG. 9 is a schematic structural diagram of a magnetic field coil for magnetic field generation for plasma transportation concerning the fourth embodiment.

FIG. 11 is a plane view of a movable aperture 70 concerning the fourth embodiment, and an installation state diagram of aperture 70.

DENOTATION OF REFERENCE NUMERALS

Figure 1:
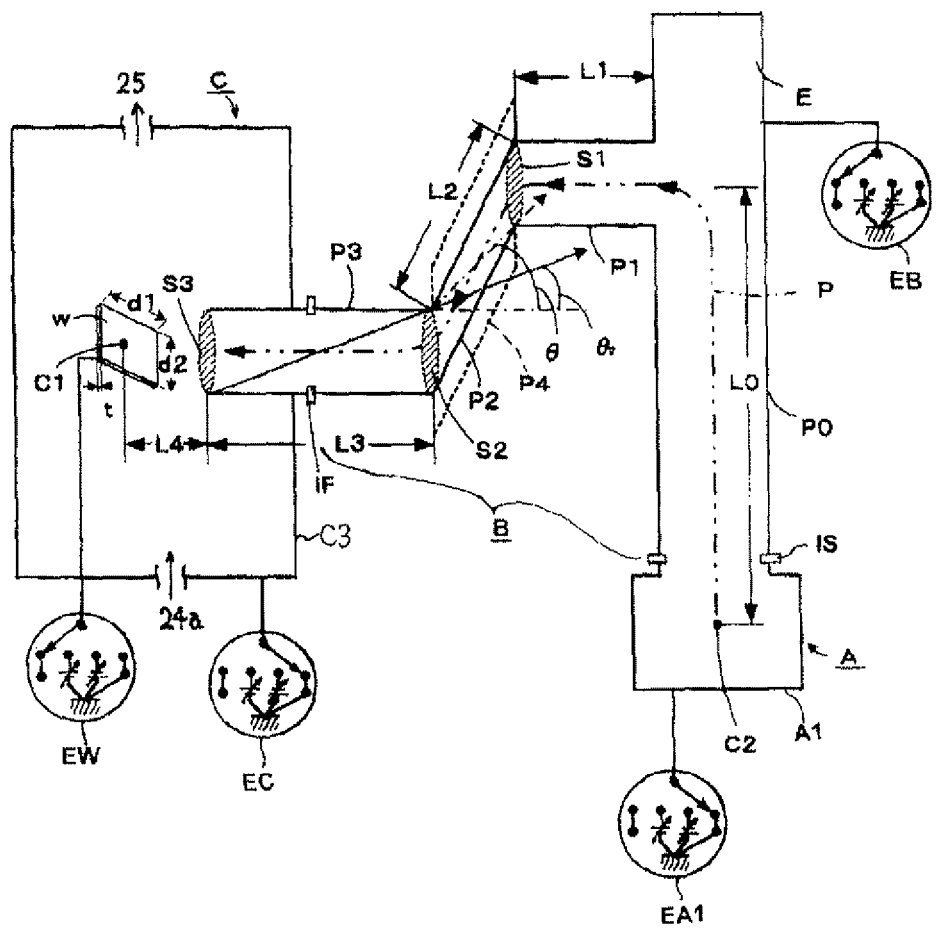
FIG. 1 is a summary structural diagram of the plasma processing apparatus concerning the first embodiment of the present invention (starting end side insulator and finishing end side insulator).

1 Plasma processing portion
2 Plasma generating portion
3 Plasma straightly advancing tube
4 First plasma advancing tube
5 Second plasma advancing tube
6 Third plasma advancing tube
7 Plasma outlet
8 Arrow
9 Arrow
10 Cathode
11 Trigger electrode
12 Anode
13 Arc power supply
14 Cathode protector
15 Plasma stabilizing magnetic field generator
16 Insulation plate
17 Magnetic field coil
18 Magnetic field coil
19 Magnetic field coil
20 Magnetic field coil
21 Magnetic field coil
22 Deflection magnetic field generating means
23 Deflection magnetic field generating means
24 Deflection magnetic field generating means
24a Gas inflow port
25 Exhaust port
27 Magnetic pole
28 Magnetic pole
29 Movable yoke
30 Deflection magnetic field generating coil
31 Guiding body
32 Guiding groove
33 Pin
34 Fastening nut
35 Slide member
36 Spacer
37 Adjusting portion main body
38 Slide groove
39 Pin
40 Fastening nut
41 Droplet collecting plate (baffle)
42 Droplet collecting plate (baffle)
43 Droplet collecting plate (baffle)
44 Droplet collecting plate (baffle)
60 Droplet collecting plate (a part of a baffle)
61 Inner circumferential tube
62 Opening
63 Bias power supply
70 Aperture
71 Opening
72 Stopper
73 Screw
74 Protrusion
75 Tube
76 Engagement recess
77 Arrow
108a X-direction oscillating magnetic field generator
108b Y-direction oscillating magnetic field generator
1109 Outlet tube
102 Plasma generating portion
104 Cathode
106 Trigger electrode
108 Anode
109 Plasma
1110 Power supply
112 Plasma processing portion
114 Object to be treated
116a Plasma stabilizing magnetic field generator
116b Plasma stabilizing magnetic field generator
1100 Plasma straightly advancing tube
1101 First plasma advancing tube
1102 Second plasma advancing tube
1103 Third plasma advancing tube 1104 Connecting port
1105 Plasma outlet
1106 Plasma outlet
1107 Rectifying tube
1108 Frustoconical tube
1110 Plasma outlet
1111 Arrow
1112 Arrow
1113 Magnetic field coil for scanning
1114 Rectifying magnetic field coil
A Plasma generating portion
A1 Plasma generating portion container
A2 Target exchange portion
B Plasma transport tube
B01T Transport tube
B2 Second transport tube
B23 Bending transport tube
B3 Third transport tube
C Plasma processing portion
C1 Installation position
C2 Target position
C3 Processing component container
CT Connection terminal
E Bias power supply
EA1 Bias power supply for container
EA2 Bias power supply for exchange portion container
EB Bias power supply for transport tube
EB01T Bias power supply for transport tube
EB 2 Bias power supply for second transport tube
EB23 Bias power supply for bending transport tube
EB3 Bias power supply for third transport tube
EC Bias power supply for processing component
EW Bias power supply for object to be treated
FT Floating terminal
GND Ground
GNDT Grounding terminal
IF Finishing end side insulator
II1 First middle insulator
IS Starting end side insulator
IA Inter-container insulator
II2 Second middle insulator
NVT Variable negative voltage terminal
P0 Plasma straightly advancing tube
P1 First plasma advancing tube
P2 Second plasma advancing tube
P3 Third plasma advancing tube
P4 Radially enlarged tube
PVT Variable positive voltage terminal
S1 Plasma outlet
S2 Plasma entrance port
S3 Plasma outlet
VT Variable terminal
W Work

BEST MODE FOR CARRYING OUT THE INVENTION

Below, embodiments of the plasma processing apparatus concerning the present invention are explained in detail, based on the attached figures.

FIG. 1 is a summary structural diagram of the plasma processing apparatus concerning the first embodiment of the present invention (starting end side insulator and finishing end side insulator). The plasma processing apparatus shown in said figure comprises plasma generating portion A generating plasma to be supplied to plasma processing portion (chamber) C, together with plasma transport tube B. In plasma processing portion C, work (object to be treated by plasma) W is set up, a reactive gas is introduced as necessary by a gas introduction system connected into the chamber from gas inflow port 24a, and reactant gas and plasma stream are exhausted from exhaust port 25 by a gas exhaust system. Plasma generating portion A has a cathode (target) that generates plasma by vacuum arc discharge under a vacuum environment. Plasma transport path B comprises a tube passage that mobilizes plasma, and plasma transport path B has a structure of a droplet removing portion that removes droplets produced as a byproduct from the cathode by its geometrical structure. This plasma transport path B is also a plasma stream distribution tube passage, and comprises plasma straightly advancing tube P0 connected to plasma generating portion A, first plasma advancing tube P1 connected in a bent manner to plasma straightly advancing tube P0, second plasma advancing tube P2 inclinedly arranged and connected at the finishing end of first plasma advancing tube P1 in a predetermined bending angle with respect to the tube axis, and third plasma advancing tube P3 connected in a bent manner at the finishing end of second plasma advancing tube P2 so that plasma is exhausted from the plasma outlet.

Figure 5:
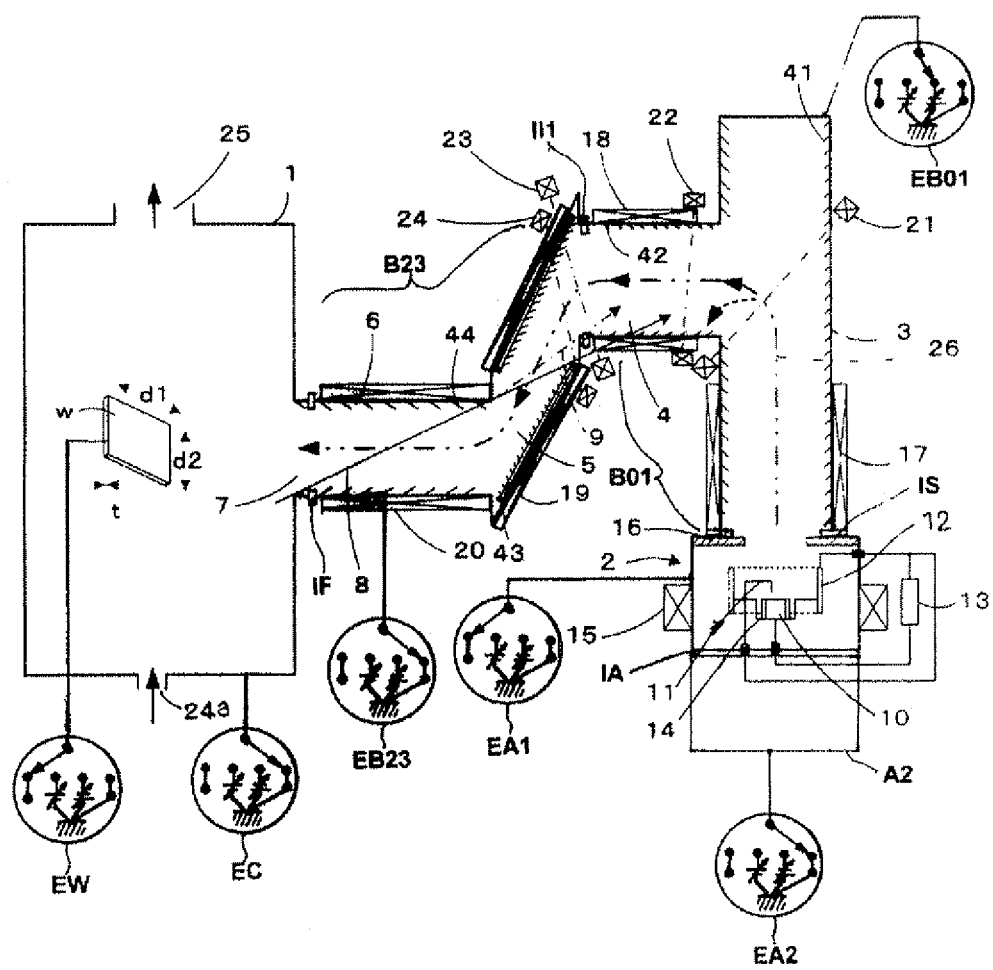
FIG. 5 is a summary structural diagram of a plasma processing apparatus concerning the fourth embodiment (second embodiment with further details) of the present invention.

Outlet S3 of said third plasma advancing tube P3 is inserted deeply and extended inside the outer wall surface of said plasma processing portion C, but as shown in FIG. 5 described below, said outlet S3 may be directly connected to said outer wall surface through a flange (not shown). The connection type can be adjusted freely.

Plasma straightly advancing tube P0 adheres and removes droplets advancing straightly from plasma generating portion A by colliding them against finishing end section E opposite plasma generating portion A, or against the tube inner wall. The plasma advancing length from said target position C2 of plasma generating portion A to the outlet of plasma straightly advancing tube P0, that is to say, the connection point between plasma straightly advancing tube P0 and first plasma advancing tube P1, is defined as L0. First plasma advancing tube P1 communicates and connects toward the perpendicular direction at the side wall of the finishing end side of plasma straightly advancing tube P0. The plasma advancing length of first plasma advancing tube P1 is defined as L1. Second plasma advancing tube P2 is inclinedly arranged between first plasma advancing tube P1 and third plasma advancing tube P3, and its plasma advancing length is defined as L2. Third plasma advancing tube P3 is placed toward a parallel direction with respect to first plasma advancing tube P1, and its plasma advancing length is defined as L3. The plasma outlet of third plasma advancing tube P3 is extended inside the plasma processing portion C. The plasma effective distance in which the plasma exhausted from the plasma outlet of third plasma advancing tube P3 arrives at installation position C1 of the object to be treated in plasma processing portion C is defined as L4. A plasma advancing path formed in a bent manner in three stages is formed by plasma straightly advancing tube P0, first plasma advancing tube P1, second plasma advancing tube P2, and third plasma advancing tube P3.

Around the outer circumference of each plasma advancing tube, a magnetic field coil (not shown) for generating a magnetic field for plasma transportation is wound with a purpose to transport plasma stream P along the tube passage. By magnetic field generating means for plasma transportation comprising of magnetic field coil, a magnetic field for plasma transportation is generated in the whole three stages of said bent pathway, and the plasma transport efficiency is improved. Also, a baffle (not shown) for droplet removal is set up in the tube inner wall.

Figure 14:
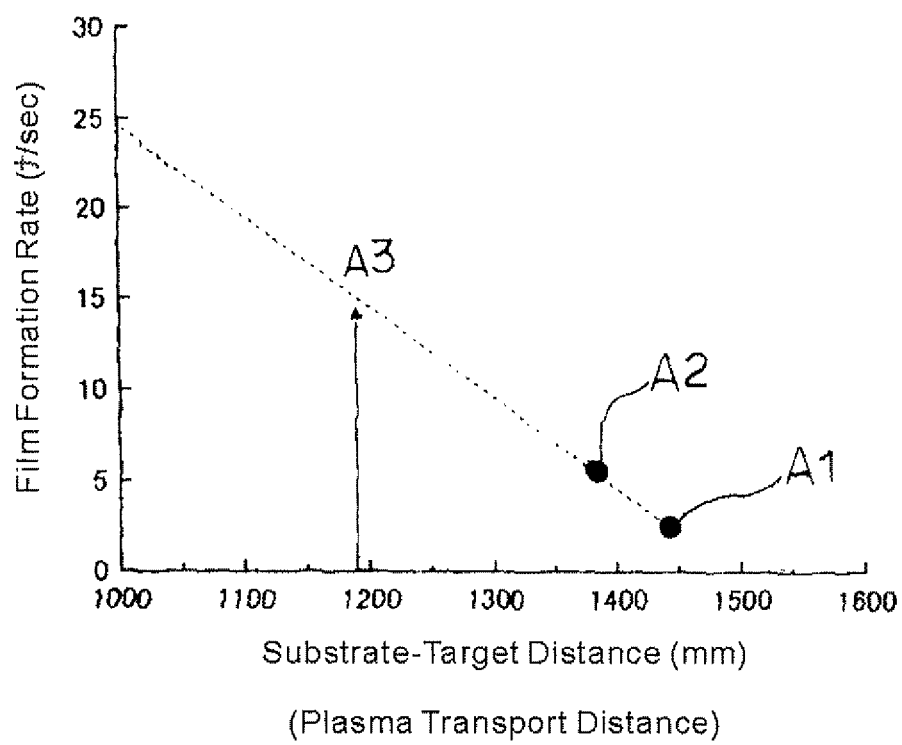
FIG. 14 is a relational figure showing the relation of the plasma transport distance as opposed to the film formation.
Figure 15:
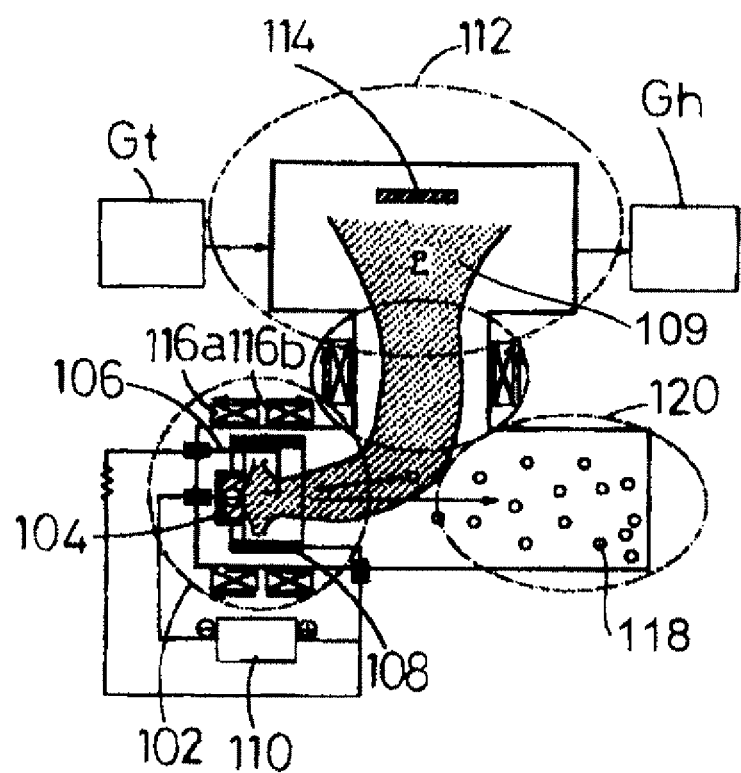
FIG. 15 is a schematic configuration diagram of a conventional plasma processing apparatus.

In the plasma advancing path concerning the above configuration, total length (plasma transport distance) L(=L0+L1+L2+L3+L4), which is the sum of plasma advancing lengths L0-L3 respectively of the interval from the target surface to the outlet of plasma straightly advancing tube P0, first plasma advancing tube P1, second plasma advancing tube P2, and third plasma advancing tube P3, together with plasma effective distance L4, is set to satisfy 900 mm≤L≤1350 mm. In the present embodiment, L is set to be 1190 mm, as shown in A3 of FIG. 14. Under setting of this plasma transport distance, when a plasma exposure was done on one piece of substrate in the same manner as the above verification experiments for A1 and A2, and a film formation of thickness of 3 nm was carried out, a film formation rate of about 1.5 nm/sec was obtained.

According to the present embodiment, the plasma transport distance in the above plasma advancing path is shortened further than a conventional T-shaped plasma advancing path and a curved plasma advancing path, and thus the film formation rate can be improved. Moreover, not only the straight advancing path is shortened, but also droplets are removed with higher efficiency by said pathway bending in three stages, and thus high purity plasma that can realize an improvement of the surface treatment precision of film formation and such can be generated. That is to say, the plasma transport distance is shortened in comparison to the cases in which a plasma advancing path bent in a T-shape (A1) and a bent plasma advancing path (A2) were used, and moreover, a high film formation rate (about 1.5 nm/sec) can be obtained as a good film formation condition for use in semiconductor substrates.

In the present embodiment, the plasma advancing path consists of said bent pathway of three stages, and furthermore, by the tube passage placement shown in FIG. 1, an extremely good droplets removal effect is obtained. By this droplet removal effect, when plasma was irradiated for 4 seconds against a substrate (work W) with a size of 2.5 in (inch) width d1, 2.5 in (inch) length D2, and an arbitrary thickness t, the deposited number of droplets became less than 10-100.

Second plasma advancing tube P2 is placed geometrically at a position off the straight line of sight from plasma outlet S3 of third plasma advancing tube P3 to the plasma outlet S1 side of first plasma advancing tube P1. That is to say, when the angle of elevation from the tube cross section top end of the plasma entrance port S2 side of third plasma advancing tube P3 to the tube cross section bottom end of the plasma outlet S1 side of first plasma advancing tube P1 is defined as $\theta$, and when the angle of elevation from the tube cross section bottom end of the plasma outlet S3 side of third plasma advancing tube P3 to the tube cross section top end of the plasma outlet S2 side of second plasma advancing tube P2 is defined as $\theta_0$, $\theta \geq \theta_0$ is satisfied.

By the above geometric tube passage placement, straightly advancing droplets led out from first plasma advancing tube P1 are prevented from directly intruding third plasma advancing tube P3, so that they cannot be exhausted from plasma outlet S3 of third plasma advancing tube P3. Therefore, it becomes possible to adhere and remove the droplets by collision at the pathway inner wall during said bent pathway process of three stages, the adhesion mass of the droplets on the object to be treated can be reduced greatly as described above, and a plasma treatment by high purity plasma from which droplets have been removed with high efficiency can be done.

In the present embodiment, said bent pathway of three stages is connected and composed on a same plane, but even when the tube pathway is composed in a spatially bent manner in three stages, by the same geometric arrangement as above, a tube pathway arrangement can be realized in which the straightly advancing plasma is not exhausted directly from the plasma outlet of the third plasma advancing tube.

As shown by the broken lines, second plasma advancing tube P2 may be built as radially enlarged tube P4 whose inner diameter is greater than first plasma advancing tube P1 and third plasma advancing tube P3. That is to say, second plasma advancing tube P2 is set up as radially enlarged tube P4, first plasma advancing tube P1 is set up as an introduction side radially reduced tube connected to the plasma introduction side starting end of radially enlarged tube P4, and third plasma advancing tube P3 is set up as a discharge side radially reduced tube connected to the plasma discharge side finishing end of radially enlarged tube P4. If radially enlarged tube P4 is positioned midway, the plasma stream introduced from the introduction side radially reduced tube into the radially enlarged tube is diffused by the diameter-increasing effect of the plasma advancing path by radially enlarged tube P4. By the diffusion of this plasma stream, the droplets mixed with the plasma diffuse inside the radially enlarged tube P4, and are collided with, adhered to, and collected at the inner side wall of radially enlarged tube P4. Also, when the plasma stream in radially enlarged tube P4 is exhausted, the droplets scattered in the radially enlarged tube inner wall surface side are collided with, adhere to, and collected by the step portion by the diameter-narrowing effect from radially enlarged tube P4 to discharge side radially reduced tube, and thereby the droplets are not rejoined with the plasma stream, and a remixture of droplets can be prevented. Therefore, the droplets can be adhered to the internal side wall of radially enlarged tube P4, and thus can be collected sufficiently. Therefore, the droplets can be removed efficiently inside the tube path of first plasma advancing tube P1, second plasma advancing tube P2, and third plasma advancing tube P3. Also, when the central axes of radially enlarged tube P4 and the introduction side radially reduced tube and/or the discharge side radially reduced tube are set off instead of being lined up, the droplets become easy to separate from the plasma stream, and the capture effect of droplets increases even more. Moreover, just by forming radially enlarged tube P4 in the plasma advancing path, a droplet removing portion can be constituted easily and cheaply.

Said bent structure in three stages and angle relation $\theta \geq \theta_0$ are mainly for providing the geometric structure of plasma transport path B installed in order to remove droplets advancing straightly, such as neutral droplets. Because electrically charged droplets are influenced by the electric effect and magnetic action from the environment, they may deviate from straight advancement in an electromagnetic field because of the electric field and/or the magnetic field. Therefore, in order to remove the electrically charged droplets, it is necessary to equip with a mechanism to intentionally remove in particular the electric potential difference from the plasma transport path. Because a magnetic field for plasma transport is necessary by all means, it is difficult to remove a magnetic field in a plasma device. Because the electric force towards the electrically charged droplets can be erased when the electric potential difference is removed, in this case the electrically charged droplets have a property of advancing straightly in the same manner as neutral droplets, and it becomes possible to remove the electrically charged droplets too by the previously described geometrical structure.

Said first embodiment has a structure for removal of electrically charged droplets. Plasma generating portion A and plasma transport tube B are mutually insulated electrically by starting end side insulator IS, and moreover, plasma transport tube B and plasma processing portion C are mutually insulated electrically by finishing end side insulator IF. As a result, plasma transport tube B does not receive an electric influence from plasma generating portion A and plasma processing portion C at all, and plasma transport tube B is set so that the electric potential is constant throughout. As mentioned above, plasma transport tube B comprises plasma straightly advancing tube P0, first plasma advancing tube P1, second plasma advancing tube P2, and third plasma advancing tube P3, and because the electric potential becomes constant throughout the tube arrangement, no electric potential difference exists at all inside plasma transport tube B, and the electrically charged droplets do not receive at all an electric force from an electric potential difference inside plasma transport tube B. Therefore, electrically charged droplets too are removed inside plasma transport tube by the previously described structures in three stages and the angle relation $\theta \geq \theta_0$, in the same manner as neutral droplets.

In FIG. 1, bias power supply EA1 for container is installed at plasma generating portion container A1, bias power supply EB for transport tube is provided near plasma transport tube B, bias power supply EC is provided at processing portion container C3 that is a housing of plasma processing portion C for processing portion, and bias power supply EW for portion for object to be treated is provided near work W.

Figure 4:
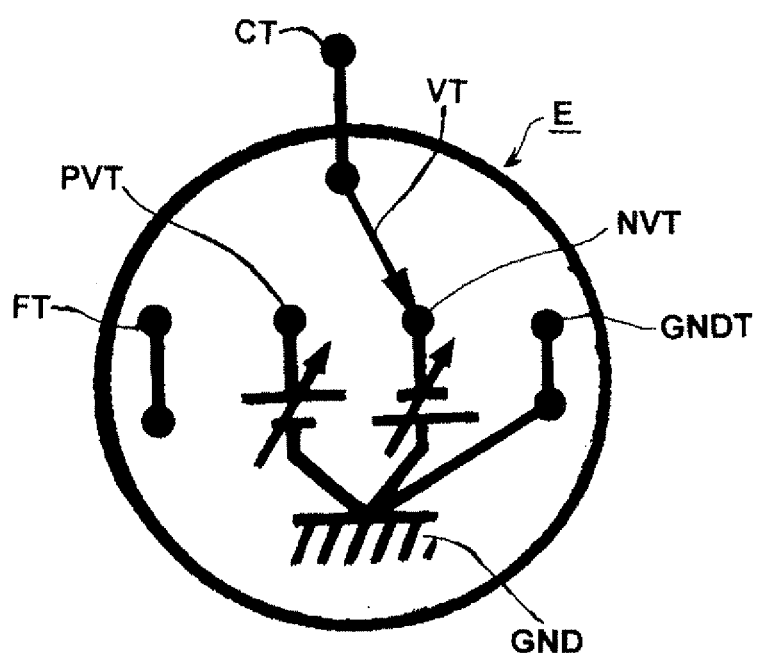
FIG. 4 is the structural diagram of a bias power supply for use in the present invention.

Each bias power supply EA1, EB, EC, and EW has a same structure, and this structure is explained by using FIG. 4. FIG. 4 is the structural diagram of a bias power supply used in the present invention. Connection terminal CT is a terminal connected to each component. Variable terminal VT attached to said connection terminal CT can be varied in four stages. The receiving side terminal of four stages comprises floating terminal FT, variable positive voltage terminal PVT, variable negative voltage terminal NVT, and grounding terminal GNDT. When said variable terminal VT is connected to said floating terminal FT, floating terminal FT is in an electrically floating state, and it is not connected to any part. When said variable terminal VT is connected to said variable positive voltage terminal PVT, a positive electric potential with respect to GND (the ground side) is applied to said component parts in a manner that it can be varied in magnitude (0 to +50V). When said variable terminal VT is connected to said variable negative voltage terminal NVT, a negative electric potential with respect to GND (the ground side) is applied in a manner that it can be varied in magnitude (0 to −50V). When said variable terminal VT is connected to said grounding terminal GNDT, said component part is grounded.

FIG. 1 shows a suitable electric potential placement, plasma generating portion container A1 is set up at GND by said bias power supply EA1 for containers, plasma transport tube B is set in an electric floating state by bias power supply EB for transport tube, processing component container C3 is set up at GND by bias power supply EC for processing component, and work W is set in an electric floating state by bias power supply for portion for object to be treated EW. Because plasma generating portion container A1 is insulated from the arc power supply for plasma generation, a safety design is done on plasma generating portion container A1 grounded by GND, for safety even upon a contact by a worker. Because processing component container C3 too is grounded by GND, it is safe even if a worker comes in contact with it. Because plasma transport tube B is in an electric floating state, and the electric potential is constant as a whole, there is no electric potential difference within plasma transport tube B as described above, and electrically charged droplets too can be surely removed in the same manner as neutral droplets by the geometrical structure for droplets removal. Work W set to an electric floating state also has a constant electric potential as a whole, therefore the electric effect on the plasma is not unbalanced, and the plasma can be received evenly throughout the entire surface.

Figure 2:
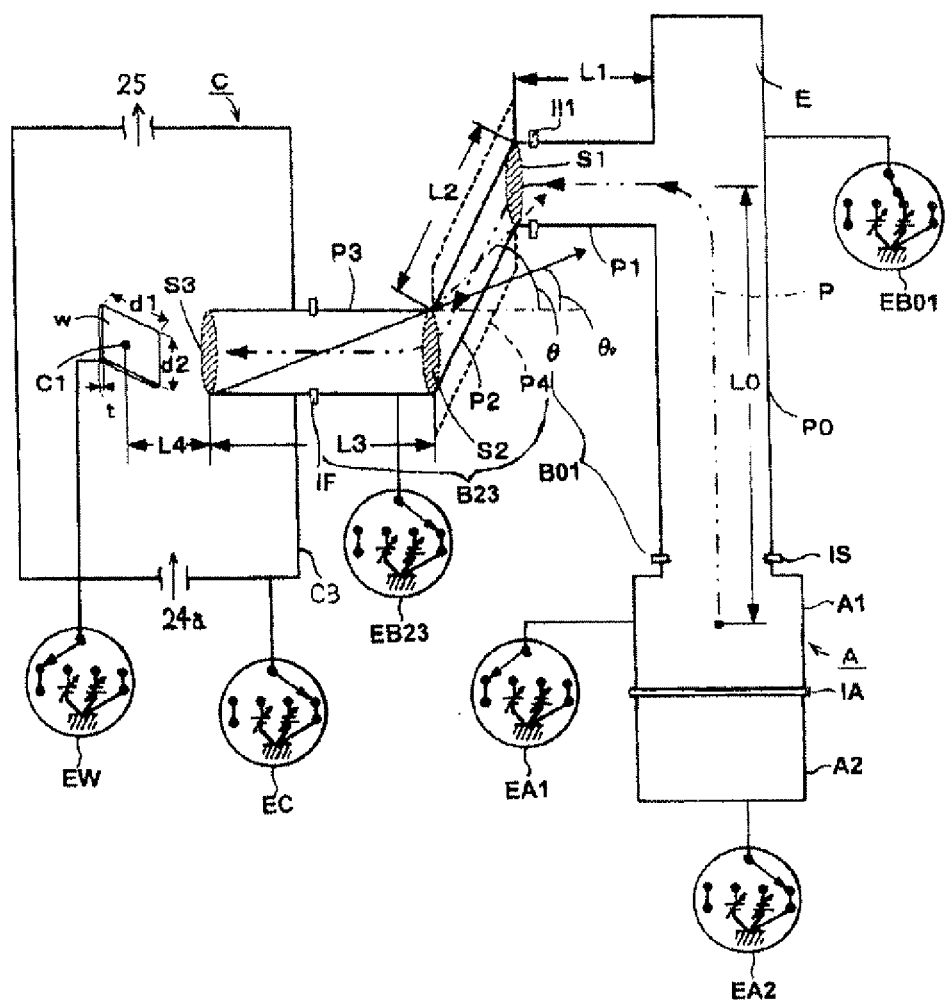
FIG. 2 is a summary structural diagram of a plasma processing apparatus concerning the second embodiment (first middle insulator) of the present invention.

FIG. 2 is a summary structural diagram of a plasma processing apparatus concerning the second embodiment (first middle insulator) of the present invention. The first difference with FIG. 1 is that target exchange portion container A2 has been set up at the bottom of plasma generating portion container A1 through inter-container insulator IA, and bias power supply EA2 for exchange portion container has been attached at target exchange portion container A2. In target interchange portion container A2, a reserve target (not shown) is built in as a replacement when the target in plasma generating portion A has worn out, and at the same time, an exchange mechanism (not shown) is built in. The second difference is that plasma transport tube B is split into T-shaped transport tube B01 and bending transport tube B23 by first middle insulator I1, bias power supply EB 23 for bending transport tube is attached at bending transport tube B23, and bias power supply EB 01 for T-shaped transport tube is attached at T-shaped transport tube B01. Otherwise it is completely same as FIG. 1, and the working effect of the difference is described in particular as follows.

Bias power supply EA2 for exchange portion container is grounded at GND, and it is designed for safety even in a case of contact by a worker. Bias power supply EA1 for the container of plasma generating portion A is set to an electric floating state, so that the electric effect toward the plasma is erased, and a stable plasma generation is promoted. Bias power supply for T-shaped transport tube is connected to variable negative voltage terminal NVT of FIG. 4, and T-shaped transport tube 1301 is dropped to a negative electric potential. It was found experimentally that the removal efficiency of electrically charged droplets increased when this negative electric potential was adjusted within a range of −5 to −10V. Bias power supply EB23 for bending transport tube is connected to GND. In this the second form, as the location of the bias power supply is varied from EA2→EA1→EB→EB 23, the electric potential of the tubing work varies from GND→floating state→(−5 to −10V)→GND, and it became clear from the current experimental examples that this change in the electrical potential is effective for removal of electrically charged droplets. The reason is not clear, but it can be thought that when the electric potential is varied to be GND→negative electric potential→GND, positive droplets are adsorbed electrically by the transport tube in the first GND→negative electric potential change, and negative droplets are adsorbed electrically by the transport tube in the next negative electric potential→GND change. potential→GND change.

Figure 3:
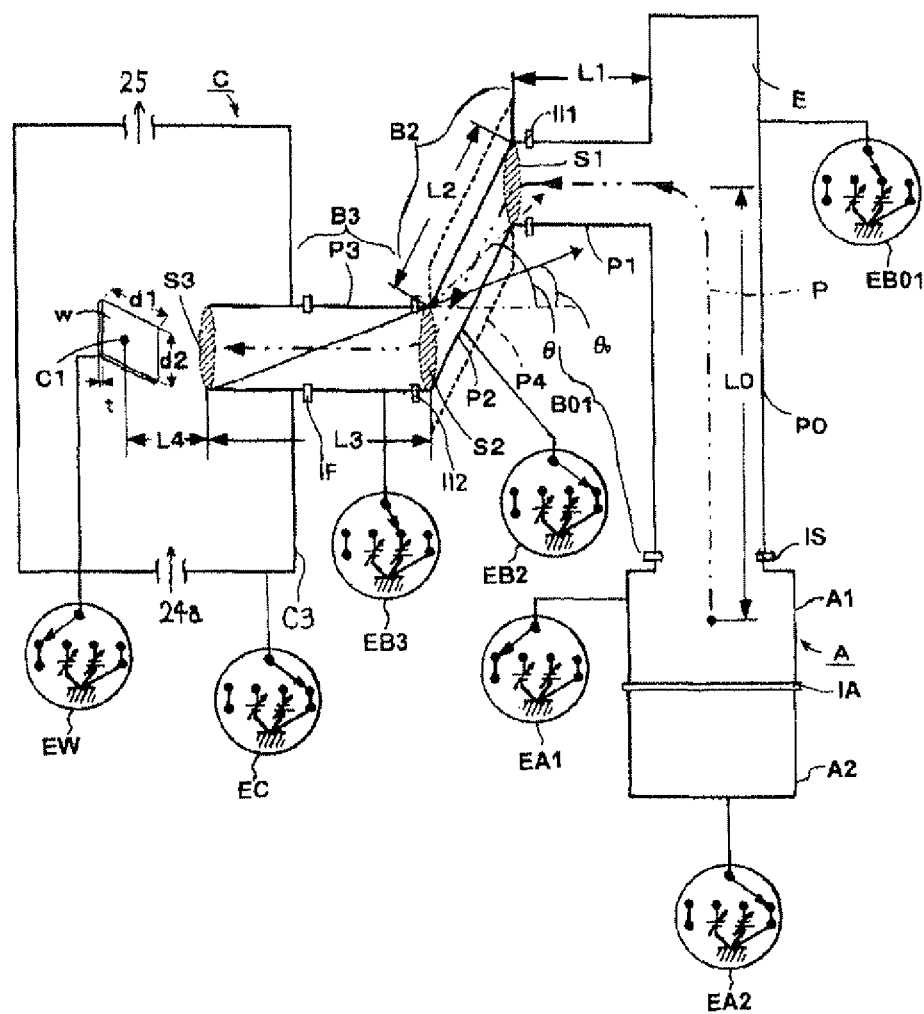
FIG. 3 is a summary structural diagram of a plasma processing apparatus concerning the third embodiment (first middle insulator and second middle insulator) of the present invention.

FIG. 3 is a summary structural diagram of a plasma processing apparatus concerning the third embodiment (first middle insulator and second middle insulator) of the present invention. The difference with FIG. 2 is that bending transport tube B23 has been split into second transport tube B2 and third transport tube B3 by second intermediate insulator I2. As a result, bias power supply EB2 for second transport tube has been attached to second transport tube B2, and bias power supply EB3 for third transport tube has been attached to third transport tube B3. Otherwise, it is completely same as FIG. 2, and the working effect of the difference is described in particular as follows.

In FIG. 3, bias power supply EB2 for second transport tube is grounded by GND, and bias power supply EB3 for third transport tube is connected to variable negative voltage terminal NVT of FIG. 4 so that it is set to a negative electric potential. It was obtained experimentally that it becomes favorable if the negative electric potential of bias power supply EB3 for third transport tube is adjusted within a range of 0 to −15V. In this third embodiment, as the location of the bias power supply varies from EA2→EA1→EB01→EB2→EB3, the electric potential of its tubing work varies from GND→floating state→(−5 to −10V)→GND→negative electric potential. It became clear from current experimental examples that this electric potential variation is effective for removal of electrically charged droplets. The reason is not clear, but it can be thought that when the electric potential changes from GND→negative electric potential→GND→negative electric potential, positive droplets are adsorbed electrically by the transport tube in the first GND→negative electric potential change, negative droplets are adsorbed electrically by the transport tube in the next negative electric potential→GND change, and furthermore, the remaining positive droplets are adsorbed electrically by the transport tube in the next GND→negative electric potential change.

As explained above, the variable positive electric potential of each bias power supply EW, EC, EB3, EB2, EA1, EA2, and EB01 can be adjusted within a range of 0 to +50V, and the variable negative electric potential is adjusted within a range of 0 to −50V. The electric potential of each bias power supply is varied and adjusted so that the droplet removal efficiency of the apparatus as whole is maximized within these electric potential ranges.

Next, an installation example of magnetic field coils that are suitable for a plasma processing apparatus in the present invention is explained, as well as an installation example of baffles (collecting plates) for droplet removal.

FIG. 5 is a summary structural diagram of a plasma processing apparatus concerning the fourth embodiment (second embodiment with further details) of the present invention. An apparatus of this FIG. 5 is the apparatus of FIG. 2 with installation at the outer tube circumference of a magnetic field coil generating a magnetic field for plasma transportation. Also, it shows a plasma processing apparatus in which baffles for droplet removal are set up in the tube inner wall. In this embodiment, the connection mode is adopted in which the outlet of the third plasma advancing tube is directly connected to the outer wall surface of plasma processing portion 1. In the same manner as FIG. 2, inter-container insulator IA, starting end side insulator IS, first middle insulator II1, and finishing end side insulator IF are placed, and they comprise the electric insulation of the apparatus as a whole. There is a difference also in that the member reference numerals are shown as alphabetical characters in FIG. 2, but the member reference numerals are shown as numerical characters in FIG. 5. However, this is not a substantive difference. Also, an alphabetical reference numeral shows a same member in FIG. 2 as in FIG. 5, and because the configuration and the working effect are already described in FIG. 2, the explanation of the equivalent parts is omitted in FIG. 5, and therefore, the structural geometry of droplet removal is mainly explained below.

Plasma processing apparatus of FIG. 5 comprise plasma processing portion (chamber) 1, a plasma processing apparatus comprising plasma generating portion 2 generating plasma to be supplied to plasma processing portion 1, together with plasma transport tubes. A plasma transport tube comprises a plasma distribution tube passage in which a droplet removing portion for removing droplets is positioned, just as in FIG. 2. In the following, because the structure of plasma transport tube B in itself constitutes a droplet removing portion, "droplet removing portion" signifies plasma transport tube B that has a droplet removal structure. The droplet removing portion of this fourth embodiment comprises plasma straightly advancing tube 3 connected to plasma generating portion 2, first plasma advancing tube 4 connected in a bent manner to plasma straightly advancing tube 3, second plasma advancing tube 5 diagonally arranged and connected at the end of first plasma advancing tube 4 in a predetermined bending angle against its tube axis, and third plasma advancing tube 6 connected in a bent matter at the finishing end of second plasma advancing tube 5 so that it exhausts plasma from plasma outlet 7.

The plasma transport tube comprising plasma straightly advancing tube 3, first plasma advancing tube 4, second plasma advancing tube 5, and third plasma advancing tube 6 is formed in a bent manner in three stages, just like the plasma transport tube of FIG. 2. Plasma outlet 7 of third plasma advancing tube 6 is connected to plasma introduction port of plasma processing portion 1.

Also, second plasma advancing tube 5 is placed geometrically at a position off the line of sight from plasma outlet 7 of third plasma advancing tube 6 to the plasma outlet side of first plasma advancing tube 4, in the same manner as FIG. 2. That is to say, when, as shown by arrow 8, the angle of elevation from the tube cross section bottom end of plasma outlet 7 side of third plasma advancing tube 6 to the tube cross section top end of the plasma outlet side of second plasma advancing tube 5 is defined as $\theta_0$, angle of elevation ($\theta$) as shown by arrow 9, from tube cross section top end of the plasma entrance port side of third plasma advancing tube 6 to the tube cross section bottom end of the plasma outlet side of first plasma advancing tube 4, satisfies $\theta \geq \theta_0$. By the same geometric tube passage placement as FIG. 2, a direct intrusion of straightly advancing droplets led out from first plasma advancing tube 4 into third plasma advancing tube 6 is prevented, so that they do not get exhausted from plasma outlet 7 of third plasma advancing tube 6.

Plasma generating portion 2 comprises cathode (cathode) 10, trigger electrode 11, anode (anode) 12, arc power supply 13, cathode protector 14, and plasma stabilizing magnetic field generator (an electromagnetic coil or a magnet) 15. Cathode 10 is the supply source of the plasma constituent, and its formation material is not limited particularly as long as it is a solid having electroconductivity. A simple metal, an alloy, a simple inorganic substance, an inorganic compound (metallic oxide/nitride) and such can be used individually or as a mixture of two or more substances. Cathode protector 14 electrically insulates parts other than evaporating cathode surface, and prevents a backward diffusion of plasma generated between cathode 10 and anode 12. The formation material of anode 12 is not limited particularly, as long as it does not evaporate at the plasma temperature, and it is a nonmagnetic material that is a solid having electroconductivity. Also the configuration of anode 12 is not limited particularly, as long as it does not obstruct an advancing of arc plasma as a whole. Furthermore, plasma stabilizing magnetic field generator 15 is placed around the circumference of plasma generating portion 2, and it stabilizes the plasma. When arc stabilization magnetic field generator 15 is placed so that the applied magnetic field on the plasma is in mutually reverse direction (cusp form), the plasma is stabilized further. Also, when arc stabilization magnetic field generator 15 is placed so that the applied magnetic field on the plasma is in mutually same direction (mirror form), the deposition rate by the plasma can be improved. Furthermore, plasma generating portion 2 and each plasma tube path are electrically insulated by plasma generating portion side insulation plate 16, and the construction is such that, even if a high voltage is applied to plasma generating portion 2, the portions at forward of plasma straightly advancing tube 3 is in an electrically floating state, so that plasma does not receive an electrical influence inside the plasma advancing path. Also, a processing component side insulation plate (finishing end side insulator IF) is placed between third plasma advancing tube 6 and plasma processing portion 1, the whole of the duct portion for plasma transportation from plasma straightly advancing tube 3 to third plasma advancing tube 6 is set to an electrically floating state, and constructed so that the transported plasma is not influenced by an external power supply (high voltage source and/or GND).

In plasma generating portion 2, an electric spark is triggered between cathode 10 and trigger electrode 11, a vacuum arc is generated between cathode 10 and anode 12, and plasma is generated. Constituent particles of this plasma includes vaporized material from cathode 10, and charged particles originating from the vaporized material and the reactant gas (ion, electron), together with molecules in pre-plasma state, and neutral particles such as atoms. Also, at the same time that plasma constituent particles are ejected, droplets with size from less than submicron to several hundred micron (0.01-1000 μm) are ejected. These droplets form a mixed state with plasma stream 26, and move inside the plasma advancing path as droplet mixture plasma.

At the plasma transport tube comprising plasma straightly advancing tube 3, first plasma advancing tube 4, second plasma advancing tube 5, and third plasma advancing tube 6, a magnetic field generating means for plasma transportation comprising magnetic field coils 17, 18, 19, 20 wound around each tube circumference is installed. The plasma transport efficiency can be improved by generating a magnetic field for plasma transportation throughout the entire three stages of said bent pathway.

Because the plasma advancing path is formed in a bent manner in three stages, magnetic field coil 21 generating a bending magnetic field and deflection magnetic field generating means 23 are installed at the tube connecting portion of first plasma advancing tube 4 and second plasma advancing tube 5, and they bend and guide the plasma stream by the bending magnetic field. Because a coil for bending magnetic field cannot be wound evenly at the connecting section of first plasma advancing tube 4 and second plasma advancing tube 5, heterogeneity of the magnetic field is produced in which the bending magnetic field becomes strong inward of the bending portion. To eliminate this uneven magnetic field, deflection magnetic field generating means 22, 24 are provided by first plasma advancing tube 4 and second plasma advancing tube 5.

Figure 6:
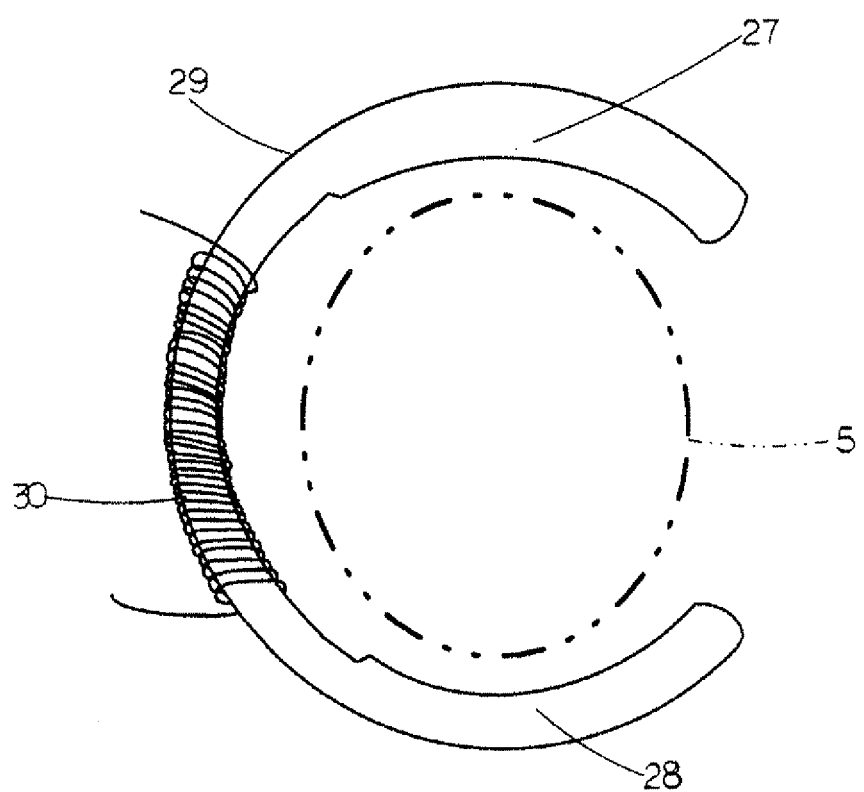
FIG. 6 is a layout drawing showing the placement state of movable yoke 29 concerning the fourth embodiment.

Deflection magnetic field generating means 22, 24 consist of deflection magnetic field generating coil 30 and movable yoke 29. FIG. 6 shows a state in which movable yoke 29 is arranged around the outer circumference of the second plasma advancing tube 5. Around movable yoke 29, deflection magnetic field generating coil 30 is wound, and it has a pair of magnetic poles 27, 28. A deflection magnetic field is generated between magnetic poles 27, 28, and applied toward the plasma in second plasma advancing tube 5.

Figure 7:
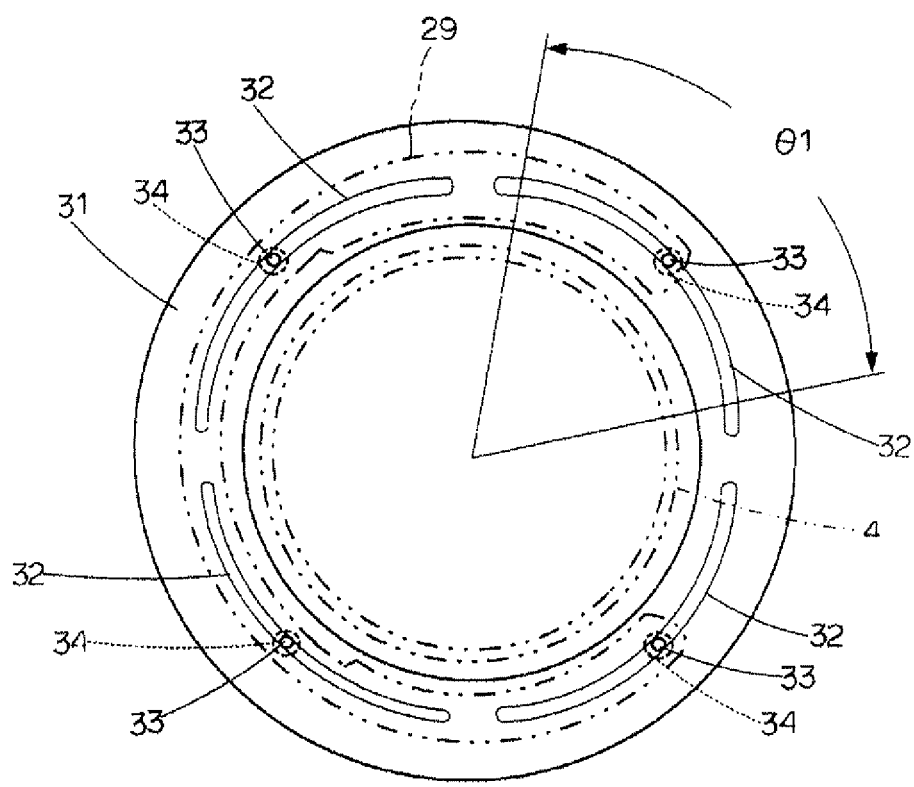
FIG. 7 is a structural diagram showing a rotating adjustment mechanism of movable yoke 29.
Figure 8:
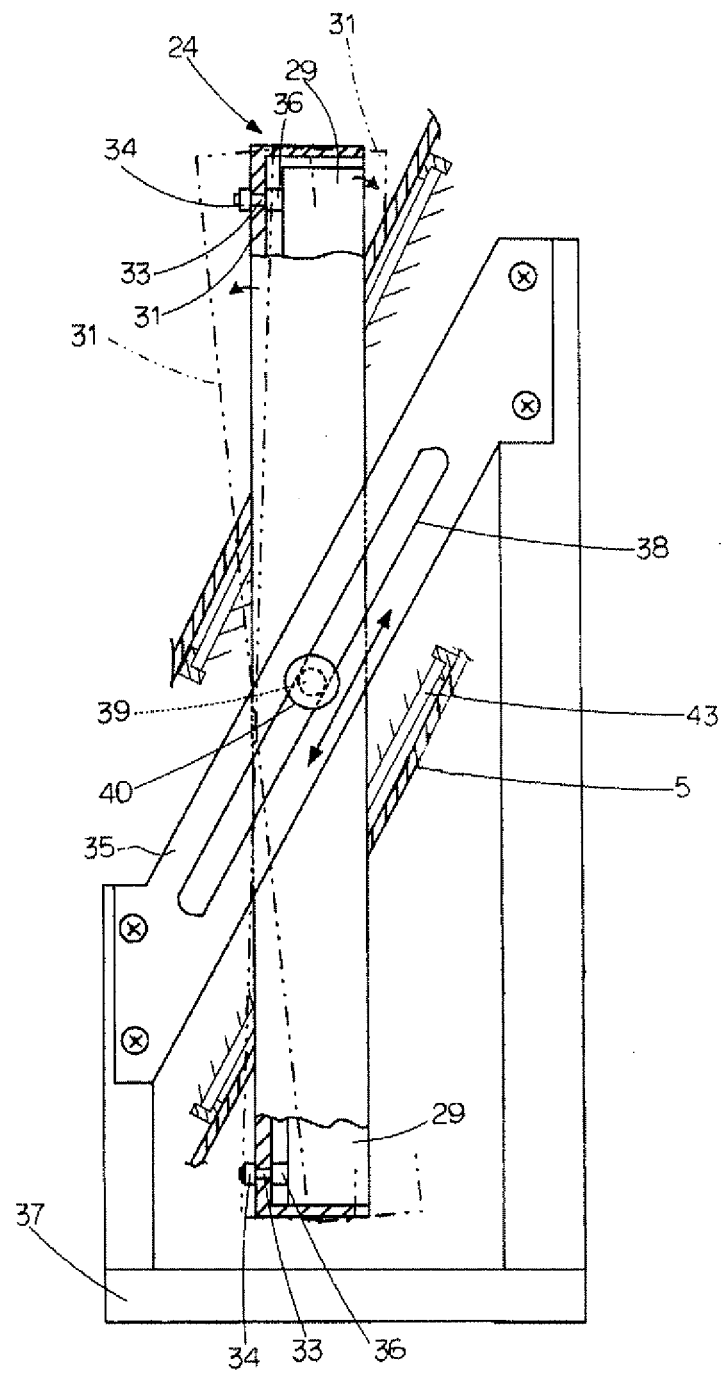
FIG. 8 is a structural diagram showing a slide adjustment mechanism and a swing adjustment mechanism of movable yoke 29.

Deflection magnetic field generating means 22, 24 include an adjustment mechanism, in which movable yoke 29 is adjusted by sliding along the tube axis direction, rotating along the circumferential direction, and swinging toward the tube axis direction. FIG. 7 shows a rotating adjustment mechanism of movable yoke 29 positioned around the outer circumference of first plasma advancing tube 4. The rotating adjustment mechanism comprises guide body 31 in which arc-like guiding grooves 32 that rotationally adjust movable yoke 29 in circumferential direction are installed in four places. Pins 33 set up at movable yoke 29 are inserted into guiding groove 32, and by sliding pins 33 in the tube circumferential direction, movable yoke 29 can be rotationally adjusted within angle adjustable range θ1 of less than or equal to 90 degrees. After the adjustment, the adjustment angle can be maintained by tightening pins 33 to guiding body FIG. 8 shows an adjustment mechanism in which movable yoke 29 positioned circumferentially around the outer circumference of second plasma advancing tube 5 is adjusted by sliding toward the tube axis direction and by swinging toward the tube axis direction. Guiding body 31 is supported by slide member 35 in the state in which movable yoke 29 is fastened and held through spacer 36. Slide member 35 has straight slide groove 38 along the tube axis direction of second plasma advancing tube 5, and it is fastened to adjusting portion main body 37. Slide groove 38 is formed parallel to the inclination center line of second plasma advancing tube 5. The slide groove set up on first plasma advancing tube 4 is formed horizontally along the center line of first plasma advancing tube 4. Pin 39 set up on guiding body 31 is inserted into guiding groove 38, and by sliding pin 39 along the tube axis direction, movable yoke 29 of guiding body 31 can be slide-adjusted throughout almost the entire tube length of the second plasma advancing tube. After the adjustment, its adjusted position can be maintained by tightening pin 39 to slide member 35 with fastening nut 40. Also, guiding body 31 is supported on slide member 35 so that it is free to rotate around the axis of pin 39, in a state in which it fastens and holds movable yoke 29. Movable yoke 29 can be swing-adjusted (tilt angle adjustment) toward the tube axis direction by rotating around the axis of pin 39. After the adjustment, the adjustment tilt angle can be maintained by tightening pin 39 to slide member 35 with fastening nut 40. The adjustable tilt angle is 5° toward the first plasma advancing tube 4 side, and 30° toward the opposite side.

Because deflection magnetic field generating means 22, 24 make possible to adjust movable yoke 29 in a sliding manner in the tube axis direction, a rotating manner in the circumferential direction, and a swinging manner in the tube axis direction, a removal of the heterogeneity of the magnetic field for plasma transportation can be carried out by a fine adjustment by said deflection magnetic field through adjusting the position or the angle of movable yoke 29, and an optimum plasma advancing path comprising a geometrical arrangement of said bent pathway in three stages can be realized.

(9A) of FIG. 9 schematically shows state 19A in which a magnetic field coil for magnetic field generation for plasma transportation is wound in a circle M1-like configuration around an inclinedly arranged second plasma advancing tube 5 along its inclination axis. In this case, as shown by the hatched lines in the figure, gaps are formed near the connecting portions with other tubes (4 or 6) in which the coil is not wound, producing a heterogeneity in the magnetic field, and reducing the plasma transport efficiency.

In the present embodiment, magnetic field coil 19 wound around the outer tube circumference of second plasma advancing tube 5 comprises a magnetic field coil wound elliptically along the inclination axis outside its outer tube circumference. (9B) of FIG. 9 schematically shows state 19B in which magnetic field coil 19 for magnetic field generation for plasma transportation is wound in an oval M2-like configuration around an inclinedly arranged second plasma advancing tube 5 along its inclination axis. Because a gap such as the hatched areas in (9A) is prevented by setting up magnetic field coil 19 wound in an oval M2-like configuration on second plasma advancing tube 5, a plasma treatment using a high density and high purity plasma can be made possible by densely winding a magnetic field coil to the inclined surface of second plasma advancing tube 5 and improving the plasma transport efficiency without generating an uneven magnetic field.

To the plasma transport tube comprising plasma straightly advancing tube 3, first plasma advancing tube 4, second plasma advancing tube 5, and third plasma advancing tube 6, droplet collecting plates (baffles) 41, 42, 43, 44 are implanted on each respective tube inner wall surface. Structure of each collecting plate is explained in detail in the following.

Figure 10:
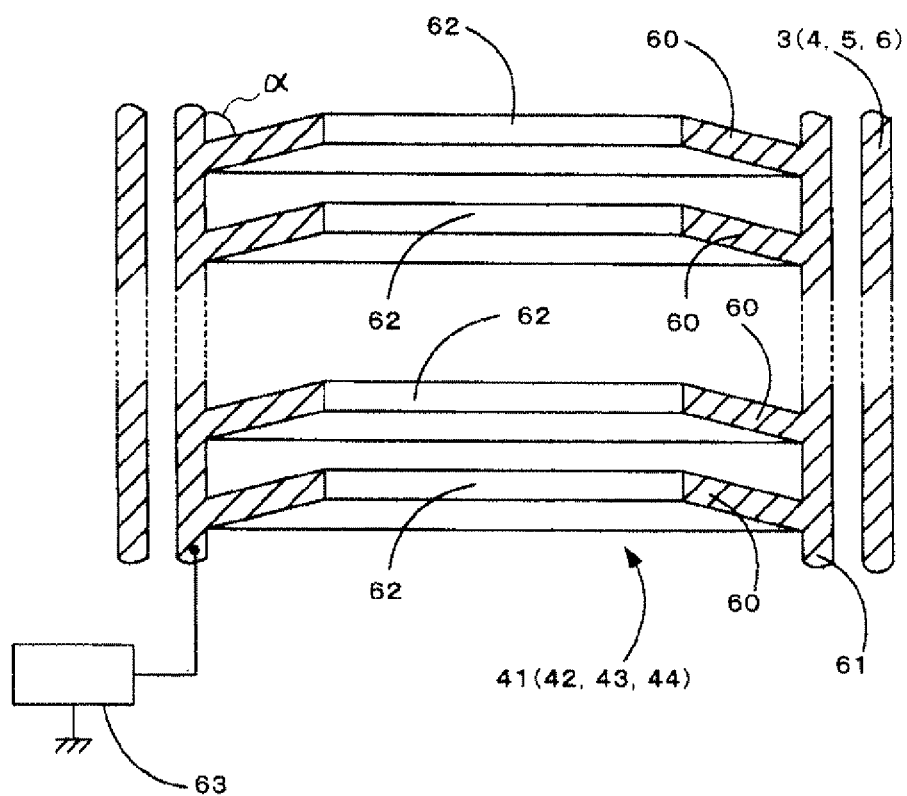
FIG. 10 is a partially enlarged cross-sectional view of inner circumferential tube 61 concerning the fourth embodiment.

FIG. 10 is a partially enlarged cross-sectional view of inner circumferential tube 61 having droplet collecting plate 60. Inner circumferential tube 61 is built inside each plasma tube path (3-6), and a few droplet collecting plates 60 are implanted into its inner wall. Plasma stream circulation opening 62 is formed in the center of droplet collecting plate 60. The plasma flows in from the upper part of the figure, and passes through opening 62. Angle of inclination a of droplet collecting plate 60 is set within the range of 15-90°, but 30-60° is suitable according to experience, and it is set to α=60° in this embodiment. By this angle of inclination, the droplets separated from the plasma stream are reflected repeatedly by droplet collecting plates 60, and are adhered and collected reliably.

The droplet adhesion surface area of inner circumferential tube 61 is increased by multiple droplet collecting plates 60, and the scattered droplets can be adhered and collected in large quantities reliably. Because, in a plasma transport tube, the installation number of droplet collecting plates 60 is restricted by the limit of the tube length of inner circumferential tube 61, in order to increase the droplet removal area, it is preferable to do a rough surface processing on the surface of droplet collecting plates 60, and thus form rough surfaces having innumerable unevenness. That is to say, by roughening the surface of droplet collecting plates 60, the capture area of droplet collecting plates 60 is increased, and the collection efficiency can be improved. Also, the droplets collided in the recesses are adhered reliably in the recesses, and the droplet collection efficiency increases markedly. Linear pattern processing and pearskin processing can be used for the surface-roughening processing. For a linear pattern processing method, for example, a polishing treatment with an abrasive paper is used. For example, in a pearskin processing method, a blast treatment by alumina, shots, grids, glass beads and such is used. Especially, a microblast processing, in which particles of a few microns are accelerated and nozzle-sprayed, can apply a minute unevening processing on the small surfaces of droplet collecting plates 60.

The implanting area of droplet collecting plates 60 is preferably greater than or equal to 70% of the tube inner wall surface area. In the case of FIG. 2, the implanting area is made to be about 90% of the tube inner wall surface area. The scattering droplets can be adhered and collected reliably in a large quantity by the increase of the droplet adhesion surface area inside the tube for the plasma advancing path, and thus a high purity of the plasma flow can be realized.

Droplet collecting plates 60 are shielded electrically from the tube wall of each plasma advancing tube. To inner circumferential tube 61, inner circumferential tube bias power supply 63 is connected as bias voltage application means, and inner circumferential tube 61 can be set to positive electric potential, set to negative electric potential, or grounded to GND. In a case where the bias electric potential of inner circumferential tube 61 is a positive electric potential, it has an effect of pushing the positive ions of the plasma in the transportation direction, and in a case of a negative electric potential, it has an effect of pushing the electrons of the plasma in the transportation direction. The choice of either the positive or the negative is chosen toward the way in which the plasma transportation efficiency is not decreased, and it is decided from the state of the plasma. The electric potential strength is variable too, and it is usually chosen to set inner circumferential tube 61 to +15V from the standpoint of the transportation efficiency. By applying a bias voltage to each droplet collecting plate, its bias electric potential is adjusted, and attenuation of the plasma can be thus suppressed, thereby increasing the plasma transportation efficiency.

In second plasma advancing tube 5, one or more apertures 70 movable along the tube axis direction may be arranged. Said aperture 70 has a structure in which the installation position can be varied along the tube axis direction in second plasma advancing tube 5. A structure that can be moved both forward and backward is acceptable, and a structure that can be moved in only one direction is also acceptable. Because it is movable, the installation position of the aperture can be adjusted, and it also can be removed and washed. This aperture 70 has an opening of a predetermined area at the center, and the droplets are collided and captured on the peripheral wall surface of this opening, while the plasma passing through said opening advances. Said opening may be set up at the center, or it may be set up at an eccentric position. It can be designed in various manners. Therefore, if multiple apertures 70 are installed movably in second plasma advancing tube 5, the removal efficiency of the droplets increases, and the plasma purity can be improved. In the following, an aperture movable in one direction and using flat springs is shown.

(11A) of FIG. 11 is a plane view of a movable aperture 70, and (11B) of said figure shows an installation state of aperture 70. Aperture 70 has a ring form having opening 71 of a predetermined area at the center. Here, the shape of said opening can be designed in a circular or an oval shape among others, depending on the placement configuration. At 3 locations of the surface of aperture 70, stoppers 72 comprising outward-protruding elastic pieces (for example, flat springs) are fastened by screws 73, but the fastening method can be adopted freely, such as welding. Protrusions 74 of the elastic pieces are bent downward. As shown in (11B) of FIG. 11, in the tube 75 inner wall of second plasma advancing tube 5, engagement recesses 76 for retaining aperture 70 are engraved beforehand in form of a circle. Engagement recesses 76 are set up in multiple numbers along the longitudinal direction of tube 75. When aperture 70 is inserted into tube 75 in the direction of arrow 77 while protrusions 74 of the elastic pieces are bent downward, stoppers 72 move along the tuber inner circumference surface while they push and bend. The direction of the plasma stream is the opposite direction of arrow 77. Furthermore, when aperture 70 is pushed toward the direction of arrow 77, protrusions 74 of stoppers 72 spread at engagement recess 76 by the elastic directional force, fit into engagement recess 76, and are locked. Stopper 72 cannot be moved in reverse in this locked state, and aperture 70 can be set in this locked position. When the set position is to be changed, the lock on stoppers 72 is removed upon pushing aperture 70 furthermore toward the direction of arrow 77, so that protrusions 74 can again be fitted in and locked on the next engagement recess 76.

Because aperture 70 has a structure in which it is movable to an arbitrary set position inside second plasma advancing tube 5, droplets can be collected by the decrease in the diameter of second plasma advancing tube 5 by aperture 70, and moreover, the set location can be changed appropriately so that the quantity of collection can be adjusted optimally, which contributes to an improvement in the droplet removal efficiency. The set number of apertures 70 is 1, 2 or more. In addition, opening 71 can be set up not only in the center of aperture 70, but it is possible to place it eccentrically in order to add a function to make the plasma flow inside the tube meander.

A ring shaped aperture may be arranged in a connecting section in the plasma advancing path comprising plasma straightly advancing tube 3, first plasma advancing tube 4, second plasma advancing tube 5, and third plasma advancing tube 6. In the same manner as aperture 70, by arranging this aperture for connecting section, the droplets included in the plasma stream can be collected in greater quantity, and the droplet removal efficiency can be improved, by reducing, making eccentric, or both reducing and making eccentric the tube diameter of the plasma advancing path.

In the plasma generating apparatuses of FIGS. 1 and 5, third plasma advancing tube 6 of last stage is constructed with a constant tube diameter, but it is preferable to increase in third plasma advancing tube 6 the density of the plasma stream that is exhausted from second plasma advancing tube 5 through the bent pathway. In the following, the embodiment in which a densification function is provided further in third plasma advancing tube 6 is shown.

Figure 12:
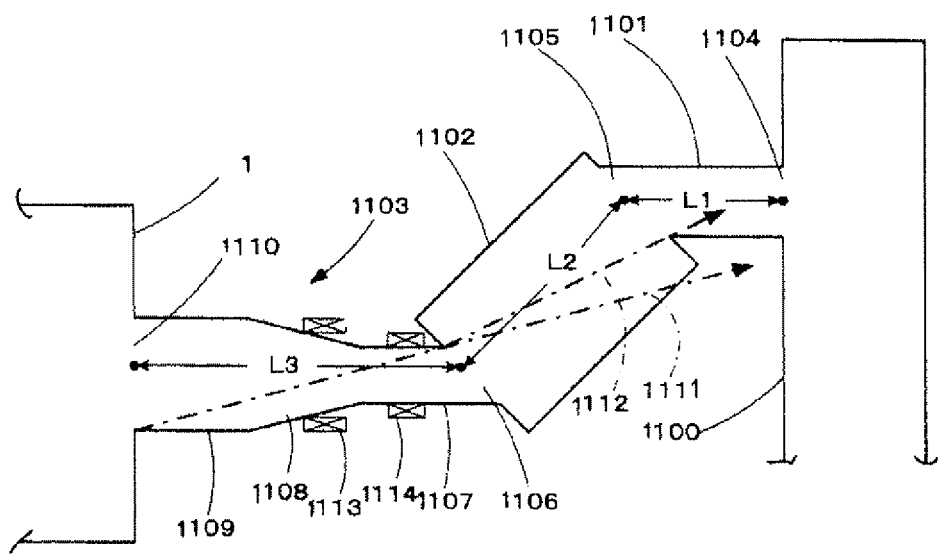
FIG. 12 is a summary structural diagram of a plasma processing apparatus of the fifth embodiment.

FIG. 12 shows the summary configuration of a plasma processing apparatus of the fifth embodiment. The plasma processing apparatus of FIG. 12, in the same manner as FIG. 5, has a plasma generating apparatus comprising a plasma generating portion (not shown) for generating plasma to be supplied to plasma processing portion 1, and a plasma transport tube. The droplet removing portion set up in the plasma transport tube, in the same manner as FIG. 2, comprises plasma straightly advancing tube 1100 connected to the plasma generating portion, first plasma advancing tube 1101 connected to plasma straightly advancing tube 1100 in a bent manner at connecting port 1104, second plasma advancing tube 1102 inclinedly arranged and connected at the finishing end of first plasma advancing tube 1101 in a predetermined bending angle against its tube axis, and third plasma advancing tube 1103 connected in a bent manner at the finishing end of second plasma advancing tube 1102 so that plasma is exhausted from plasma outlet 1106. In addition, although not illustrated, droplet collecting plates and magnetic field coils for plasma transportation magnetic field formation are arranged in the plasma transport tube The plasma transport tube comprising plasma straightly advancing tube 1100, first plasma advancing tube 1101, second plasma advancing tube 1102, and third plasma advancing tube 1103 is formed in a bent manner in three stages, in the same manner as the plasma advancing paths of FIGS. 1 and 5. Third plasma advancing tube 1103 comprises rectifying tube 1107 connected at the finishing end of second plasma advancing tube 1102, frustoconical tube 1108 that becomes a deflection/oscillation tube connected to rectifying tube 1107, and outlet tube 1109. Frustoconical tube (deflection/oscillation tube) 1108 has its diameter increased toward the outlet tube 1109 side. Plasma outlet 1110 of outlet tube 1109 is connected to the plasma introduction port of plasma processing portion 1. Outlet tube 1109 has a constant diameter. In the plasma transport tube concerning the present embodiment, the respective plasma advancing lengths L1-L3 of first plasma advancing tube 1101, second plasma advancing tube 1102, and third plasma advancing tube 1103 are set to be same as each plasma advancing tube of FIG. 1. Also, at the position off the line of sight from plasma outlet 1110 of outlet tube 1109 to the plasma outlet 1105 side of first plasma advancing tube 1101, second plasma advancing tube 1102 is placed geometrically in the same manner as FIGS. 1 and 5. That is to say, when the angle of elevation from the tube cross section bottom end of the plasma outlet 1110 side of outlet tube 1109 to the tube cross section top end of the plasma outlet 1106 side of second plasma advancing tube 1102 is defined as $\theta_0$ as shown by arrow 1112, the angle of elevation ($\theta$) from the tube cross section top end of the plasma entrance port side of rectifying tube 1107 to the tube cross section bottom end of the plasma outlet 1105 side of first plasma advancing tube 1101 as shown by arrow 1111 satisfies $\theta \geq \theta_0$ in the same manner as FIG. 1. By the same tube passage geometric placement as FIGS. 1 and 5, through avoiding the straightly advancing droplets led out from first plasma advancing tube 1101 directly intruding third plasma advancing tube 1103, they are prevented from being exhausted from plasma outlet 1110 of third plasma advancing tube 1103.

In the connecting section with third plasma advancing tube 1103 of the finishing end of second plasma advancing tube 1102 which has been inclinedly arranged, to prevent a decrease in the plasma progress efficiency to the third plasma advancing tube 1103 side through meandering and diffusion of the plasma flow, rectifying magnetic field coil 1114 is installed in rectifying tube 1107 connecting with second plasma advancing tube, so that a rectification magnetic field that rectifies while forcibly converging the plasma flow supplied from second plasma advancing tube 1102 to rectifying tube is generated in the tube. By this rectification magnetic field, the plasma flowing to second plasma advancing tube 1102 can be drawn in a converged manner at the third plasma advancing tube 1103 side, and a generation of plasma with high density and high purity becomes possible.

Figure 13:
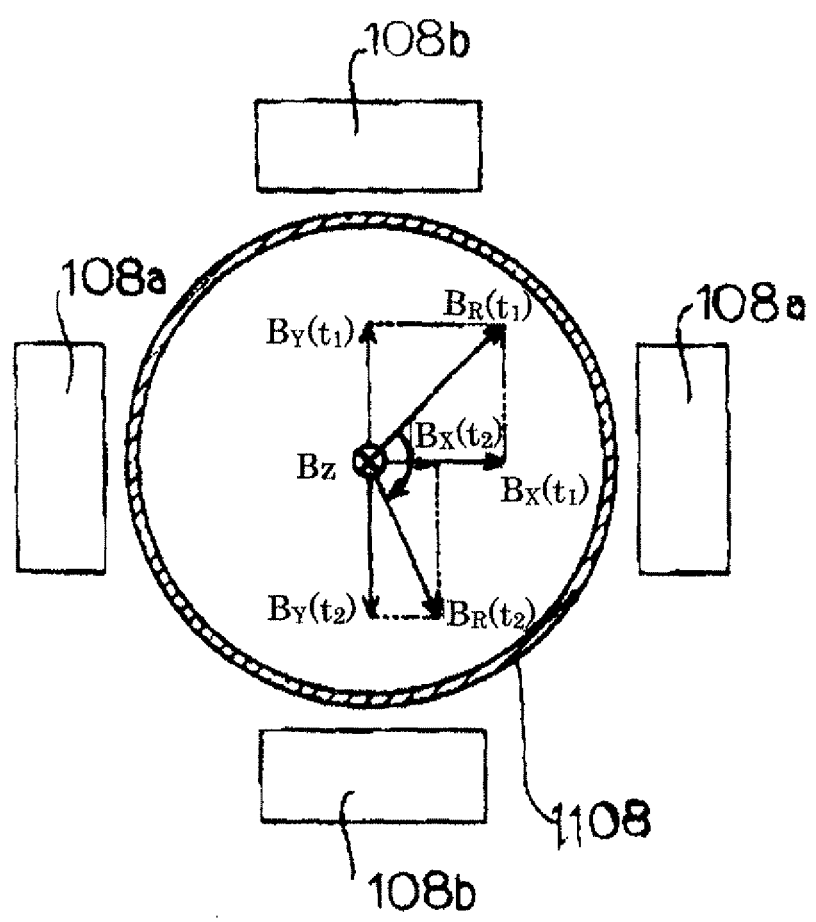
FIG. 13 is an explanatory drawing of a magnetic field for scanning formed inside frustoconical tube (deflection/oscillation tube) 1108 concerning the fifth embodiment.

FIG. 13 is an explanatory drawing of a magnetic field for scanning formed inside frustoconical tube (deflection/oscillation tube) 1108 (shown in FIG. 12) concerning the fifth embodiment. As shown in FIGS. 12 and 13, to scan the plasma stream like a CRT display by oscillating left-right and up-down the plasma stream converged and rectified by the effect of the rectification magnetic field, magnetic field coil 1113 for scanning is provided near frustoconical tube (deflection/oscillation tube) 1108 connected to rectifying tube 1107. Magnetic field coil 1113 for scanning comprises a set of X-direction oscillating magnetic field generators 108a, 108a and a set of Y-direction oscillating magnetic field generators 108b, 108b.

The relations of X-direction oscillating magnetic field $B_X(t)$ at time t by X-direction oscillating magnetic field generators 108a, 108a, Y-direction oscillating magnetic field $B_Y(t)$ at time t by Y-direction oscillating magnetic field generators 108b, 108b, and scanning magnetic field $B_R(t)$ at time t are shown. Scanning magnetic field $B_R(t)$ is a synthetic magnetic field of X-direction oscillating magnetic field $B_X(t)$ and Y-direction oscillating magnetic field $B_Y(t)$. To explain in detail, while the plasma stream is oscillated left-right by the X-direction oscillating magnetic field, the plasma stream is scanned up-down by Y-direction oscillating magnetic field, and by repeating this, a large-area plasma exposure to plasma processing portion 1 is made possible. When the cross section area of the plasma stream is smaller than the cross section area of the object to be treated placed inside plasma treatment chamber 1, the plasma stream is scanned top-bottom and left-right, so that a plasma exposure is made possible on the entire surface of the object to be treated. A similar principle is used as, for example, when the electron beam of a CRT display oscillates left-right while moving up-down, and by repeating this movement, the entire surface of the display screen is made to emit light. In FIG. 10, magnetic field $B_R(t1)$ for scanning is synthesized from oscillating magnetic fields $B_X(t1)$ and $B_Y(t1)$ at time t=t1, and while magnetic field $B_R(t1)$ for scanning oscillates left-right, magnetic field $B_R(t2)$ for scanning is formed at time $t=t2$ by oscillating magnetic fields $B_X(t2)$ and $B_Y(t2)$, so that the plasma stream can be deflected and oscillated on almost the entire surface of the tube.

The present invention is not limited to the embodiments described above. Various modifications, design alterations, and others that do not involve a departure from the technical concept of the present invention are also included in the technical scope of the present invention.

INDUSTRIAL APPLICABILITY

In the plasma processing apparatus concerning the present invention, by arranging an electrical system for removing electrically charged droplets, and by setting up a droplet removing portion with a geometric structure for removing neutral droplets together with electrically charged droplets, a highly pure and uniform plasma stream can be introduced into the plasma processing portion. Also, if high purity plasma generated by the plasma processing apparatus concerning the present invention is used, it becomes possible to form in the plasma a highly pure thin film whose defects and impurities on the surface of the solid material are markedly few, and to reform uniformly the surface characteristics of a solid without adding defects and impurities by irradiating the plasma, and a plasma processing apparatus can be provided for forming, for example, an abrasion- and corrosion-resistant reinforced film, a protective film, an optical thin film, and a transparent electroconductive film among others in high quality and precision.

The invention claimed is:

1. An insulator interposed plasma processing apparatus including
    a plasma generating portion the generates plasma from a target surface by a vacuum arc discharge under a vacuum environment,
    a plasma transport tube that transports said plasma generated by said plasma generating portion,
    a plasma processing portion that processes an object to be treated by said plasma supplied from said plasma transport tube, and
    said insulator interposed plasma processing apparatus characterized in that a starting end side insulator is interposed between said plasma generating portion and said plasma transport tube,
    a finishing end side insulator is interposed between said plasma transport tube and said plasma processing portion,
    said plasma generating portion, said plasma transport tube, and said plasma processing portion are mutually separated electrically so that an electric influence from said plasma generating portion and said plasma processing portion on said plasma transport tube is blocked,
    a deflection magnetic field generating means for deflecting a magnetic field for plasma transportation is attached in said plasma transport tube,
    said deflection magnetic field generating means consists of a deflection magnetic field generating coil and a movable yoke in a form that said deflection magnetic field generating coil is wound around said movable yoke,
    said deflection magnetic field generating means includes an adjustment mechanism, in which said movable yoke is adjusted by sliding along a tube axis, rotating along a circumferential direction and swinging toward said tube axis direction,
    a rotating adjustment mechanism comprising said deflection magnetic field generating means is installed with a guiding body, said guiding body positioned around an outer circumference of said plasma transport tube, arc-like guiding grooves are installed in four places of said guiding body, pins set up at said movable yoke are inserted into said guiding groove and said movable yoke can be rotationally adjusted by sliding said pins in said circumferential direction,
    an adjustment mechanism which slides along said tube axis direction comprises that a pin set up on said guiding body is inserted into a slide groove formed on a slide member along said tube axis direction of said plasma transport tube, and said deflection magnetic field generating means is adjusted by sliding said pin along said slide groove of said slide member,
    an adjustment mechanism which swings toward said tube axis direction by rotating said guiding body around said pin,
    said plasma transport tube is divided into a plurality of small transport tubes,
    said small transport tubes are electrically separated from one another by interposing an intermediate insulator between neighboring said small transport tubes,
    an electric influence on an arbitrary said small transport tube from other said small transport tubes is blocked, and
    said small transport tube near said plasma generating portion is set to a negative electric potential, and an electric potential higher than said negative electric potential is set in said small transport tube near said plasma processing portion.

2. The insulator interposed plasma processing apparatus of claim 1, wherein said plasma transport tube or said plurality of small transport tubes is in an electrically floating state in which an electric potential is not applied.

3. The insulator interposed plasma processing apparatus of claim 1, wherein a bias power supply for transport tube is connected to said plasma transport tube or each of said small transport tubes, so that a magnitude of an electric potential, including ground electric potential, applied to said plasma transport tube or said small transport tubes and a polarity of said electric potential can be varied.

4. The insulator interposed plasma processing apparatus of claim 1, wherein a target exchange portion container that accommodates a reserve target is positioned underneath a plasma generating portion container accommodating a target that generates plasma while being electrically insulated from said target,
    said plasma generating portion container and said target exchange portion container are separated electrically by interposing an inter-container insulator between said plasma generating portion container and said target exchange portion container,
    said plasma generating portion container is set to an electrically floating state in which an electric potential is not applied, and
    a bias power supply for said target exchange portion container is installed to said target exchange portion container so that a magnitude of an electric potential, including ground electric potential, applied by said target exchange portion container and a polarity of said electric potential can be varied.

5. The insulator interposed plasma processing apparatus of claim 1, wherein a bias power supply for processing portion is attached to a plasma processing portion container that accommodates said object to be treated, so that a magnitude of an electric potential, including ground electric potential, applied to said plasma processing portion container and a polarity of said electric potential can be varied.

6. The insulator interposed plasma processing apparatus of claim 1, wherein said object to be treated in said plasma processing portion is set to an electrically floating state in which an electric potential is not applied, or
a bias power supply for object to be treated is attached so that a magnitude of an electric potential, including ground electric potential, applied to said object to be treated and a polarity of said electric potential can be varied.

7. The insulator interposed plasma processing apparatus of claim 1, wherein said plasma transport tube is composed of
a plasma straightly advancing tube connected to said plasma generating portion,
a first plasma advancing tube connected in a bent manner to said plasma straightly advancing tube,
a second plasma advancing tube diagonally arranged and connected at a finishing end of said first plasma advancing tube in a bent manner with predetermined bending angle with respect to a tube axis of said first plasma advancing tube,
a third plasma advancing tube connected in a bent manner to a finishing end of said second plasma advancing tube so that said plasma is exhausted from a plasma outlet, and
total length L for said plasma to arrive from said target surface to said object to be treated is set to satisfy 900 mm≤L≤1350 mm.

8. The insulator interposed plasma processing apparatus of claim 7, wherein said second plasma advancing tube is placed geometrically at a position off a straight line of sight from a plasma outlet of said third plasma advancing tube to a plasma outlet side of said first plasma advancing tube.

9. The insulator interposed plasma processing apparatus of claim 8, wherein $\theta \geq \theta_0$ is satisfied when
an angle of elevation from a tube cross section top end of the plasma entrance port side of said third plasma advancing tube to a tube cross section bottom end of the plasma outlet side of said first plasma advancing tube is defined as $\theta$, and
an angle of elevation from a tube cross section bottom end of the plasma outlet side of said third plasma advancing tube to a tube cross section top end of the plasma outlet side of said second plasma advancing tube is defined as $\theta_0$.

10. The insulator interposed plasma processing apparatus of claim 7, wherein
a magnetic field generating means for plasma transportation that generates a magnetic field for plasma transportation is set up in each of said plasma straightly advancing tube, said first plasma advancing tube, said second plasma advancing tube, and said third plasma advancing tube, and
said deflection magnetic field generating means for deflecting said magnetic field for plasma transportation is attached in said first plasma advancing tube and/or said second plasma advancing tube.

11. The insulator interposed plasma processing apparatus of claim 10, wherein said magnetic field generating means for plasma transportation comprises a magnetic field coil wound around an outer tube circumference of each of said plasma straightly advancing tube, said first plasma advancing tube, said second plasma advancing tube, and said third plasma advancing tube.

12. The insulator interposed plasma processing apparatus of claim 11, wherein said magnetic field coil wound around an outer tube circumference of said second plasma advancing tube comprises a magnetic field coil wound elliptically around said outer tube circumference along an inclination axis.

13. The insulator interposed plasma processing apparatus of claim 7, wherein a droplet collecting plate is implanted into an inner tube wall surface of each of said plasma straightly advancing tube, said first plasma advancing tube, said second plasma advancing tube, and said third plasma advancing tube, an area of said implanting being greater than or equal to 70% of an inner tube wall surface area.

14. The insulator interposed plasma processing apparatus of claim 7, wherein
said second plasma advancing tube is set up as a radially enlarged tube that is radially enlarged in comparison with said first plasma advancing tube,
said first plasma advancing tube is set up as an introduction side radially reduced tube connected to a plasma introduction side starting end of said radially enlarged tube that is radially reduced in comparison with said second plasma advancing tube, and
said third plasma advancing tube is set up as a discharge side radially reduced tube that is radially reduced in comparison with said second plasma advancing tube and that is connected to a plasma discharge side finishing end of said radially enlarged tube.

15. The insulator interposed plasma processing apparatus of claim 7, wherein
a rectification magnetic field generating means for converging and rectifying in travelling direction a plasma stream supplied from said second plasma advancing tube to said third plasma advancing tube
and/or
a deflection oscillation magnetic field generating means for deflecting and oscillating said plasma stream in a cross-sectional direction is/are installed in a connecting section between said second plasma advancing tube and said third plasma advancing tube.

16. The insulator interposed plasma processing apparatus of claim 13, wherein
said droplet collecting plate implanted into said second plasma advancing tube is electrically shielded from a tube wall of said second plasma advancing tube, and
a bias voltage application means for applying a bias voltage to said droplet collecting plate is installed.

17. The insulator interposed plasma processing apparatus of claim 7, wherein one or more apertures whose installation position can be varied along a tube axis direction are arranged inside said second plasma advancing tube, and said aperture has an opening of a predetermined area.

* * * * *